US011227665B2

(12) United States Patent
Noh et al.

(10) Patent No.: US 11,227,665 B2
(45) Date of Patent: Jan. 18, 2022

(54) MAGNETIC MEMORY DEVICE

(71) Applicant: SAMSUNG ELECTRONICS CO., LTD., Suwon-si (KR)

(72) Inventors: Eunsun Noh, Yongin-si (KR); Sungchul Lee, Osan-si (KR); Unghwan Pi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/001,740

(22) Filed: Aug. 25, 2020

(65) Prior Publication Data

US 2021/0134380 A1  May 6, 2021

(30) Foreign Application Priority Data

Oct. 31, 2019  (KR) .......................... 10-2019-0138199

(51) Int. Cl.
| | |
|---|---|
| *G11C 19/08* | (2006.01) |
| *H01L 27/22* | (2006.01) |
| *G11C 11/16* | (2006.01) |
| *H01L 43/10* | (2006.01) |
| *H01L 43/02* | (2006.01) |

(52) U.S. Cl.
CPC ........ *G11C 19/0841* (2013.01); *G11C 11/161* (2013.01); *G11C 11/1675* (2013.01); *H01L 27/222* (2013.01); *H01L 43/02* (2013.01); *H01L 43/10* (2013.01)

(58) Field of Classification Search
None
See application file for complete search history.

(56) References Cited

U.S. PATENT DOCUMENTS

| | | | |
|---|---|---|---|
| 7,598,097 B2 | 10/2009 | Chen et al. | |
| 7,710,756 B2 | 5/2010 | Lim et al. | |
| 7,864,556 B2 | 1/2011 | Lim et al. | |
| 8,934,289 B2 | 1/2015 | Annunziata et al. | |
| 9,048,410 B2 | 6/2015 | Baldi et al. | |
| 9,997,565 B2 | 6/2018 | Shimada et al. | |
| 2010/0142265 A1 | 6/2010 | Atkinson et al. | |
| 2011/0186946 A1 | 8/2011 | Zhu et al. | |
| 2017/0221964 A1* | 8/2017 | Shimada | ................ H01L 43/12 |
| 2020/0168664 A1 | 5/2020 | Noh et al. | |

* cited by examiner

*Primary Examiner* — James G Norman
(74) *Attorney, Agent, or Firm* — Lee IP Law, P.C.

(57) ABSTRACT

A magnetic memory device includes a reading unit on a substrate, a magnetic track layer on the reading unit, the magnetic track layer including a bottom portion between first and second sidewall portions, and a mold structure on the bottom portion of the magnetic track layer, and between the first and second sidewall portions. The mold structure includes first and second mold layers alternately arranged in a first direction perpendicular to a top surface of the substrate, and the magnetic track layer includes magnetic domains and magnetic domain walls between magnetic domains, the first and second sidewall portions of the magnetic track layer including sidewall notches corresponding to the magnetic domain walls, and the bottom portion includes a bottom notch corresponding to one of the magnetic domain walls.

20 Claims, 33 Drawing Sheets

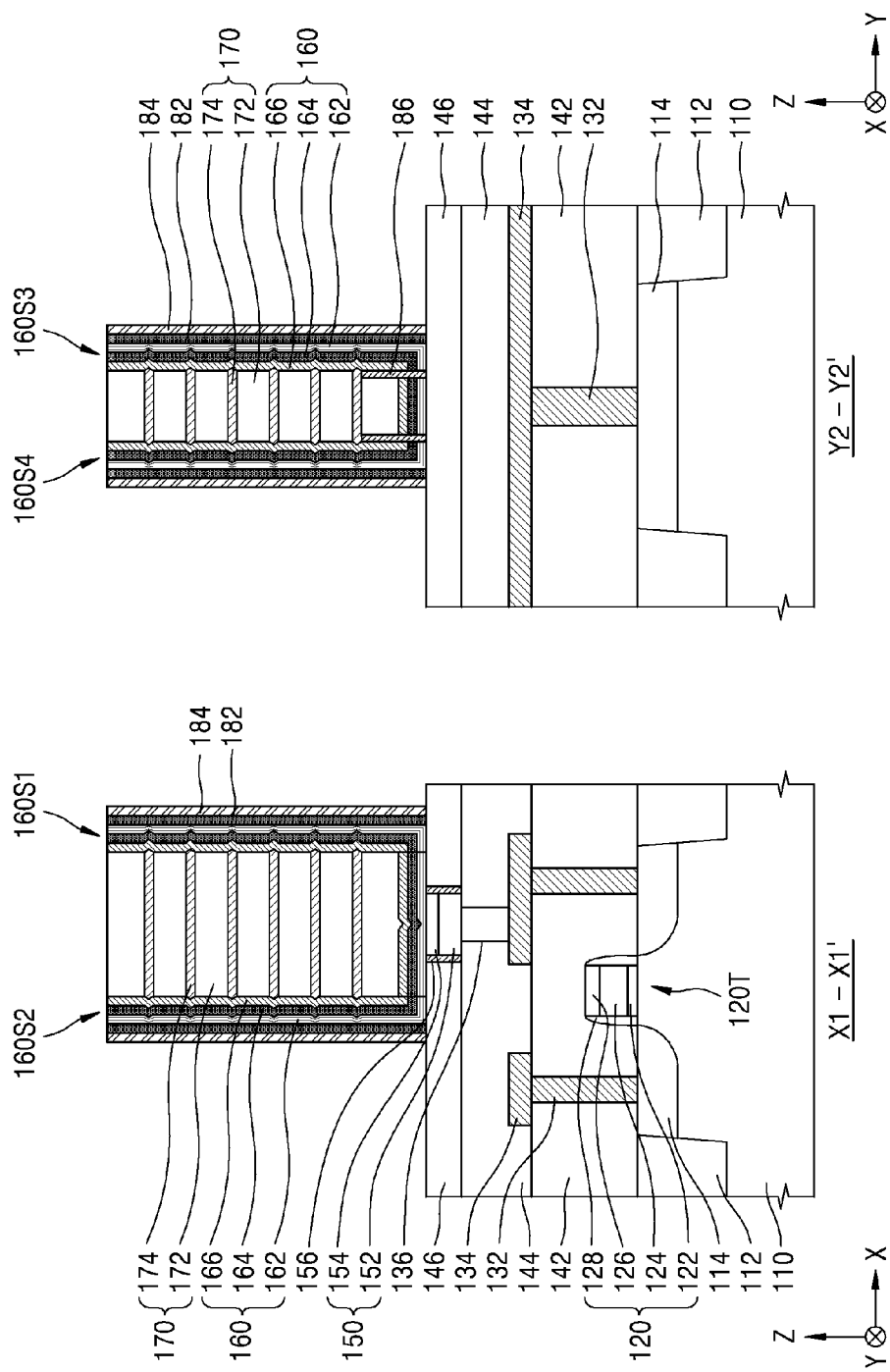

MAGNETIC MEMORY DEVICE

CROSS-REFERENCE TO RELATED APPLICATION

Korean Patent Application No. 10-2019-0138199, filed on Oct. 31, 2019, in the Korean Intellectual Property Office, and entitled: "Magnetic Memory Device," is incorporated by reference herein in its entirety.

BACKGROUND

1. Field

The present disclosure relates to a magnetic memory device, and more particularly, to a magnetic memory device including a racetrack.

2. Description of the Related Art

A magnetic memory device, of a magnetic domain wall shift register type, has been proposed. The magnetic memory device may include a racetrack with a plurality of magnetic domains and stores information by using a magnetic domain wall movement between magnetic domains.

SUMMARY

According to an aspect of embodiments, there is provided a magnetic memory device including a reading unit on a substrate, a magnetic track layer arranged on the reading unit, the magnetic track layer including a first sidewall portion, a second sidewall portion, and a bottom portion between the first sidewall portion and the second sidewall portion, and a mold structure arranged on the bottom portion of the magnetic track layer, and between the first sidewall portion and the second sidewall portion of the magnetic track layer, wherein the mold structure includes a plurality of first mold layers and a plurality of second mold layers that are alternately arranged in a first direction perpendicular to a top surface of the substrate, wherein the magnetic track layer includes a plurality of magnetic domains, and a plurality of magnetic domain walls between two adjacent magnetic domains among the plurality of magnetic domains, the first sidewall portion and the second sidewall portion include a plurality of sidewall notches corresponding to the plurality of magnetic domain walls, and the bottom portion includes a bottom notch corresponding to one of the plurality of magnetic domain walls.

According to another aspect of embodiments, there is provided a magnetic memory device including a reading unit arranged on a substrate and including a fixed layer and a tunnel barrier layer, a magnetic track layer arranged on the reading unit, the magnetic track layer including a first sidewall portion, a second sidewall portion, and a bottom portion between the first sidewall portion and the second sidewall portion, wherein the magnetic track layer includes a plurality of magnetic domains, and a plurality of magnetic domain walls between two adjacent magnetic domains among the plurality of magnetic domains, the first sidewall portion and the second sidewall portion include a plurality of sidewall notches corresponding to the plurality of magnetic domain walls, the bottom portion includes a bottom notch corresponding to one of the plurality of magnetic domain walls, and the magnetic track layer includes a free layer, a spin orbit torque (SOT) inducing layer, and a seed capping layer that are sequentially stacked in a thickness direction of the magnetic track layer.

According to another aspect of embodiments, there is provided a magnetic memory device including a reading unit on a substrate, a magnetic track layer arranged on the reading unit, the magnetic track layer including a first sidewall portion, a second sidewall portion, and a bottom portion between the first sidewall portion and the second sidewall portion, and a mold structure on the bottom portion of the magnetic track layer, and between the first sidewall portion and the second sidewall portion of the magnetic track layer, wherein the mold structure includes a plurality of protrusions protruding outwardly on a sidewall of the mold structure, and the first sidewall portion and the second sidewall portion include a plurality of sidewall notches in contact with the plurality of protrusions.

According to another aspect of embodiments, there is provided a manufacturing method of a magnetic memory device, including forming a reading unit one a substrate, the reading unit including a fixed layer and a tunnel barrier layer, forming an insulating layer on the reading unit, the insulating layer including an opening, wherein a pair of wing portions is attached to a top side of the opening, forming a bottom portion of a magnetic track layer on a bottom portion of the opening, forming a bottom notch in the bottom portion of the magnetic track layer by removing a portion of the bottom portion of the magnetic track layer vertically overlapping a location between the pair of wing portions, removing the insulating layer and the pair of wing portions, forming a mold structure on the bottom portion of the magnetic track layer, the mold structure alternately including a plurality of first mold layers and a plurality of second mold layers, and forming a sidewall portion of the magnetic track layer on a sidewall of the mold structure.

BRIEF DESCRIPTION OF THE DRAWINGS

Features will become apparent to those of skill in the art by describing in detail exemplary embodiments with reference to the attached drawings, in which:

FIGS. 8 through 15, 16A through 16C, 17 through 19, 20A, 20B, 21, 22A, 22B, and 23 through 28 illustrate cross-sectional views of stages in a method of manufacturing a magnetic memory device, according to example embodiments.

DETAILED DESCRIPTION

Hereinafter, embodiments will be described in detail with reference to the accompanying drawings.

Figure 1:
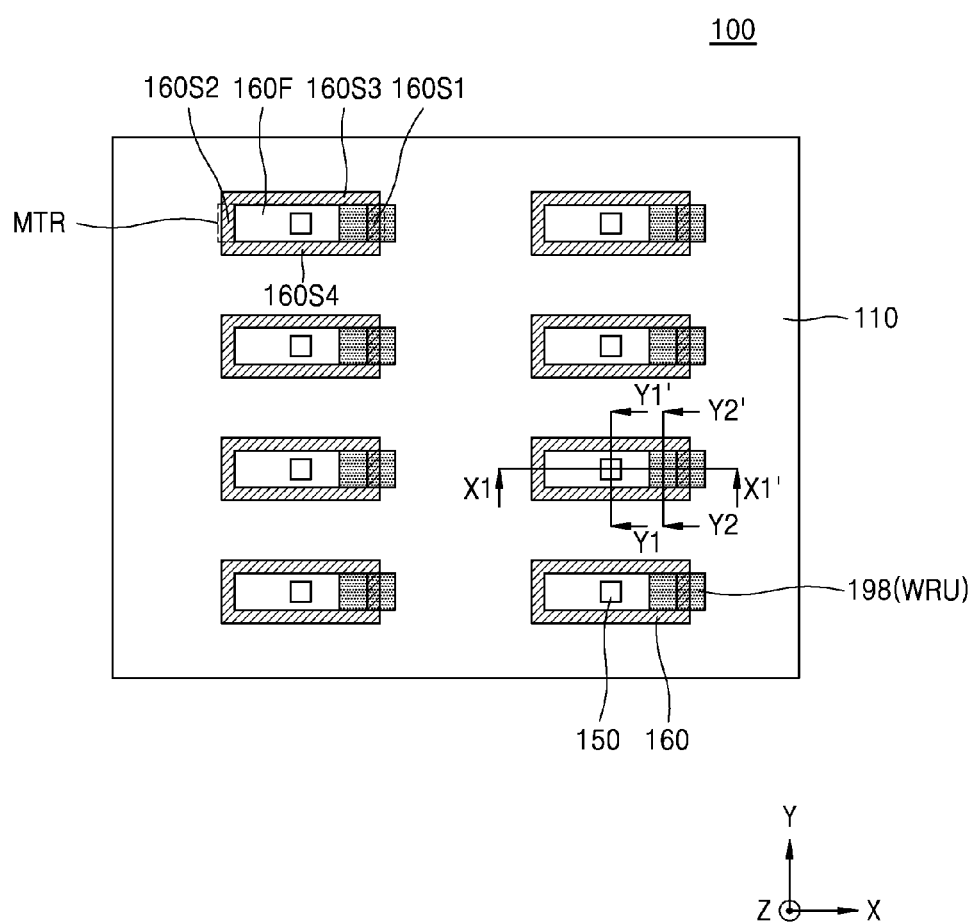
FIG. 1 illustrates a layout of a representative configuration of a magnetic memory device, according to example embodiments.
Figure 2A:
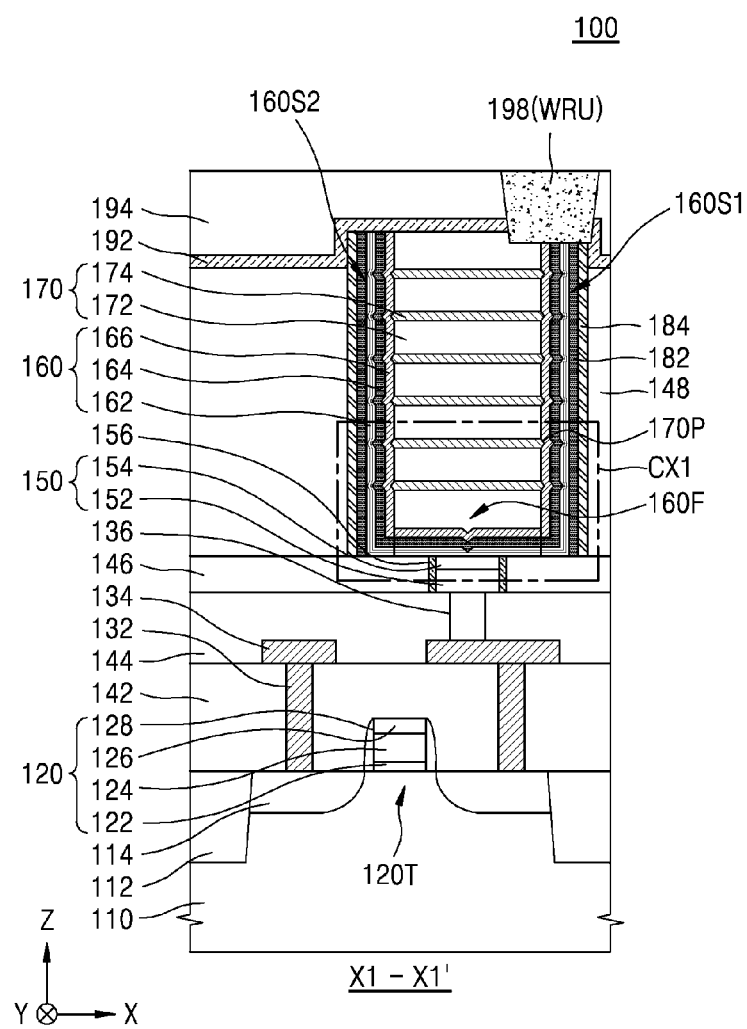
FIG. 2A illustrates a cross-sectional view along line X1-X1' in FIG. 1.
Figure 2B:
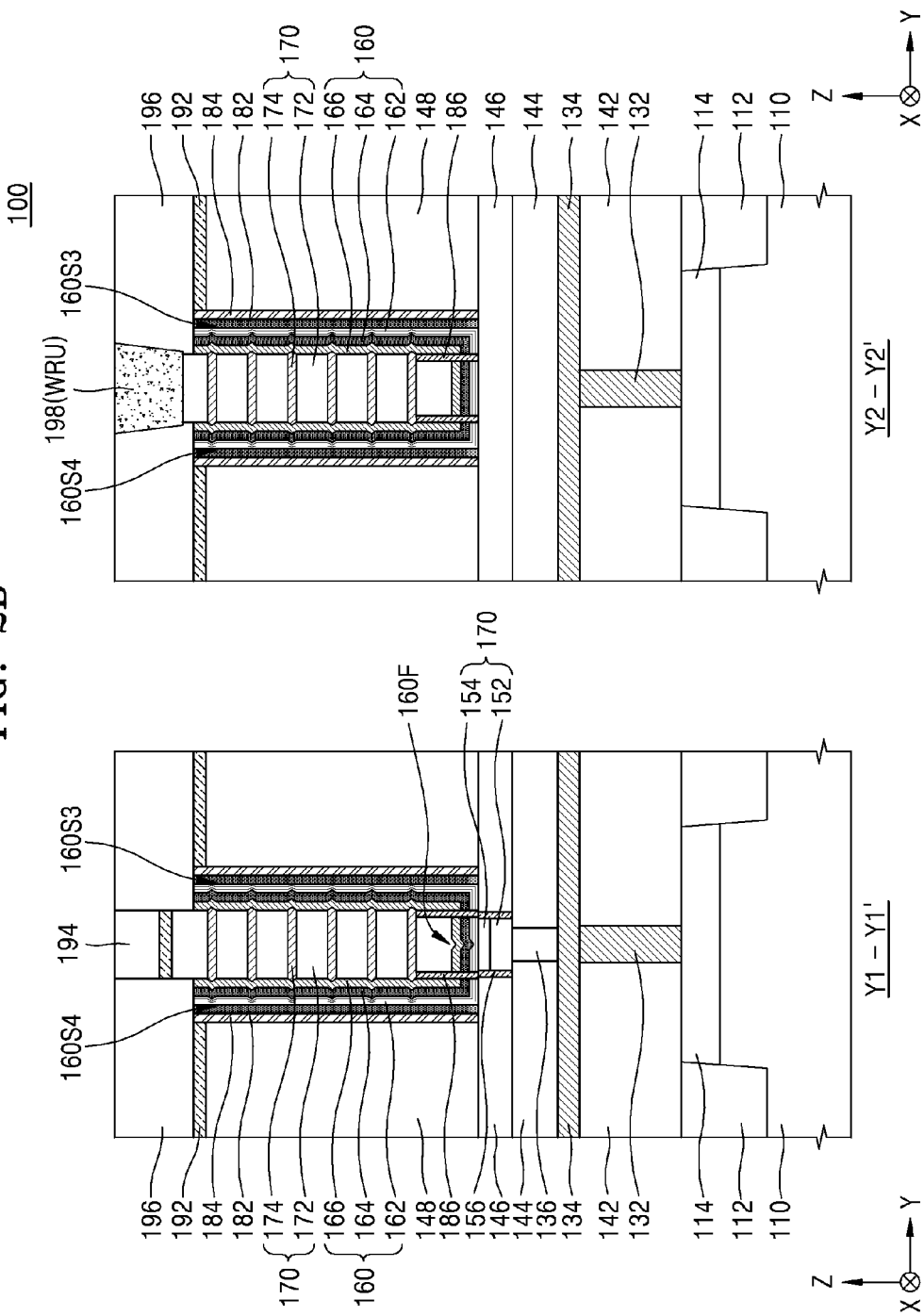
FIG. 2B illustrates a cross-sectional view along lines Y1-Y1' and Y2-Y2' in FIG. 1.

FIG. 1 is a layout illustrating a representative configuration of a magnetic memory device 100, according to example embodiments. FIG. 2A is a cross-sectional view taken along line X1-X1' in FIG. 1, FIG. 2B is a cross-sectional view taken along line Y1-Y1' and Y2-Y2' in FIG. 1, and FIG. 3 is an enlarged view of region CX1 in FIG. 2A.

Figure 3:
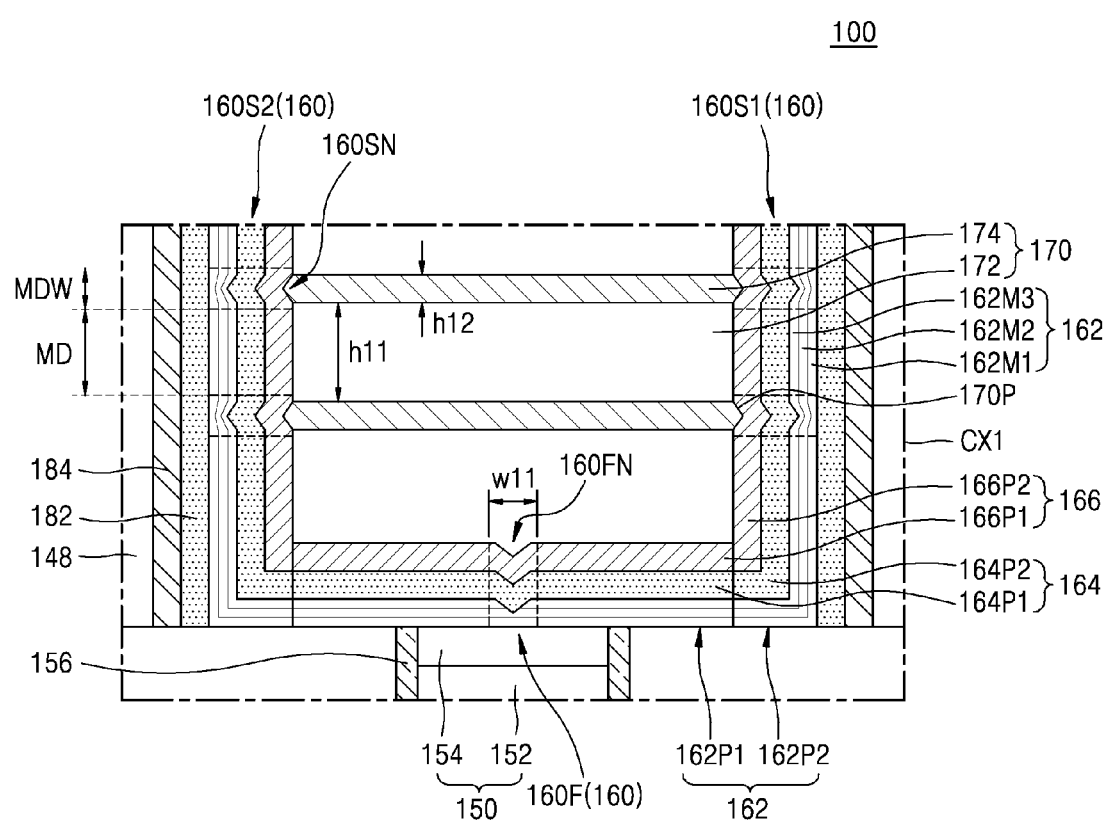
FIG. 3 illustrates an enlarged view of region CX1 in FIG. 2A.

Referring to FIGS. 1 through 3, the magnetic memory device 100 may include a switching element 120T on a substrate 110, a reading unit 150 connected to the switching element 120T, a magnetic track layer 160 connected to the reading unit 150, and a write unit WRU connected to the magnetic track layer 160.

The magnetic memory device 100 may include a data storage device that reads and writes data by writing data in a plurality of magnetic domains MD formed on the magnetic track layer 160 and reading data written in the plurality of magnetic domains MD. The magnetic track layer 160 may include the plurality of magnetic domains MD, and a magnetic domain wall MDW may be between two adjacent magnetic domains MD. In each of the plurality of magnetic domains MD, magnetic moment directions of electrons therein may be identical. The magnetic domain wall MDW may be a boundary portion between magnetic domains MD having different magnetization directions from each other, and the magnetic domain wall MDW may be moved by a current or a magnetic field applied to the magnetic track layer 160. Due to a movement of the magnetic domain wall MDW, the magnetic domain MD may pass through the write unit WRU and the reading unit 150, respectively, so that data may be written and read.

The write unit WRU may apply a certain magnetic moment direction to each of the plurality of magnetic domains MD, and accordingly, it may be configured that data of "0" or "1" is stored in each of the plurality of magnetic domains MD. The write unit WRU may be a portion of a domain wall movement device connected to the magnetic track layer 160. The domain wall movement device may include a power source, and a pulse current may be applied to the magnetic track layer 160 via the write unit WRU by the domain wall movement device. By the domain wall movement device, the magnetic domain walls MDW between the plurality of magnetic domains MD may be moved in a certain direction.

As illustrated in FIG. 2A, the write unit WRU may include a write contact 198 connected to the magnetic track layer 160. The pulse current may be sequentially applied to the plurality of magnetic domains MD via the write contact 198, and accordingly, each of the plurality of magnetic domains MD may have a certain magnetic moment direction or a certain magnetization direction. In addition, the pulse current may be applied from the domain wall movement device to the magnetic track layer 160 via the write contact 198, and then the magnetic domain wall MDW may be moved. In other embodiments, unlike as illustrated in FIG. 2A, the domain wall movement device may be connected to the magnetic track layer 160, apart from the write unit WRU.

The reading unit 150 may be configured to read data according to the magnetic moment direction of each of the plurality of magnetic domains MD. The reading unit 150 may include a device using a tunnel magneto resistance (TMR) effect or a device using a giant magneto resistance (GMR) effect. The reading unit 150 may be connected to the switching element 120T.

In example embodiments, the switching element 120T may include a gate structure 120 formed on the substrate 110 and source/drain regions 114 on both sides of the gate structure 120. An element isolation layer 112 defining an active region may be formed in the substrate 110. The gate structure 120 may include a gate insulating layer 122, a gate electrode 124, a gate capping layer 126, and a gate spacer 128 formed on the substrate 110. In FIG. 2A, the switching element 120T is exemplarily illustrated as being of a transistor type. However, the switching element 120T may include a diode, an ovonic threshold switching (OTS) element, etc.

The switching element 120T and the reading unit 150 may be electrically connected to each other by a contact 132, a wiring layer 134, and a bottom electrode 136, e.g., stacked on top of each other. A first insulating layer 142, a second insulating layer 144, and a third insulating layer 146 covering the switching element 120T, the contact 132, the wiring layer 134, the bottom electrode 136, and the reading unit 150 may be further arranged on the substrate 110.

The reading unit 150 may include a fixed layer 152 and a tunnel barrier layer 154 formed on the bottom electrode 136. A spacer 156 may be on the sidewall of the reading unit 150.

In example embodiments, the fixed layer 152 may include at least one of, e.g., Fe, Co, Ni, Pd, and Pt. In some embodiments, the fixed layer 152 may include, e.g., a Co-M1 alloy (wherein M1 is at least one metal of Pt, Pd, and Ni), or a Fe-M2 alloy (wherein M2 is at least one metal of Pt, Pd, and Ni). In some other embodiments, the fixed layer 152 may further include at least one material of, e.g., B, C, Cu, Ag, Au, Ru, Ta, and Cr. In example embodiments, the fixed layer 152 may include a material having perpendicular magnetic anisotropy (PMA), but is not limited thereto.

In example embodiments, the tunnel barrier layer 154 may include a non-magnetic insulation material. In example embodiments, the tunnel barrier layer 154 may include at least one of, e.g., an oxide of magnesium (Mg), titanium (Ti), aluminum (Al), magnesium-zinc (MgZn), and magnesium-boron (MgB), and a nitride of titanium (Ti) and vanadium (V). For example, the tunnel barrier layer 154 may include a magnesium oxide (MgO) layer or a magnesium aluminum oxide (MgAlO) layer. In other embodiments, the tunnel barrier layer 154 may include a plurality of layers. For example, the tunnel barrier layer 154 may have a stacked structure of, e.g., Mg/MgO, MgO/Mg, MgO/MgAlO, MgAlO/MgO, Mg/MaAlO/Mg, MgO/MgAlO/MgO, MgAlO/MgO/MaAlO, etc. The tunnel barrier layer 154 may have a NaCl crystal structure (for example, a face-centered cubic lattice structure).

The magnetic track layer 160 may have the stacked structure of the plurality of material layers, and may include a free layer 162, a spin orbit torque (SOT) inducing layer 164, and a seed capping layer that are sequentially arranged in a thickness direction of the magnetic track layer 160.

The free layer 162 may be in contact with the reading unit 150, e.g., with the tunnel barrier layer 154 of the reading unit 150, and a portion of the free layer 162 (that is, one of the magnetic domains MD) vertically overlapping the reading unit 150, together with the reading unit 150, may constitute a magnetic tunnel junction (MTJ). For example, a resistance value of the MTJ may vary depending on the magnetization direction of each of the fixed layer 152 and the free layer 162. For example, when the magnetization directions of the fixed layer 152 and the free layer 162 are antiparallel with each other, the MTJ of one of magnetic domains MD may have a relatively high resistance value and store data of '1'. When the magnetization directions of the fixed layer 152 and the free layer 162 are parallel with each other, the MTJ of one of magnetic domains MD may have a relatively low resistance value and store data of '0'. By using a difference between the resistance values as described above, data may be written/read in the magnetic memory device 100.

In example embodiments, the free layer 162 may have a synthetic antiferromagnet (SAF) structure. For example, the free layer 162 may have a stacked structure of a first material layer 162M1, a second material layer 162M2, and a third material layer 162M3. The first material layer 162M1 and the third material layer 162M3 may include a ferromagnetic material, and the second material layer 162M2 may include a non-magnetic material.

For example, the first material layer 162M1 and the third material layer 162M3 may include a vertical stacked structure having a vertical magnetic anisotropy. The vertical stacked structure may include a stacked structure including n ferromagnetic layers alternately and repeatedly stacked, or a stacked structure including a total of n layers of ferromagnetic and nonmagnetic layers alternately and repeatedly stacked. For example, the vertical magnetic stacked structure may include at least one of a (Co/Pt)n stacked structure, a (CoFe/Pt)n stacked structure, a (CoFe/Pd)n stacked structure, a (Co/Pd)n stacked structure, a (Co/Ni)n stacked structure, a (CoNi/Pt)n stacked structure, a (CoCr/Pt)n stacked structure, and a (CoCr/Pd)n stacked structure (here, n is a natural number). The second material layer 162M2 may include a material enabling the Ruderman-Kittel-Kasuya-Yosida coupling between ferromagnetic layers, and may include at least one of, e.g., ruthenium (Ru), iridium (Ir), and rhodium (Rh).

The SOT inducing layer 164 may include at least one non-magnetic metal material of, e.g., tungsten (W), platinum (Pt), tantalum (Ta), hafnium (Hf), rhenium (Re), iridium (Ir), gold (Au), silver (Ag), titanium (Ti), and copper (Cu). In addition, the SOT inducing layer 164 may include at least one topological insulating material of, e.g., bismuth telluride ($Bi_2Te_3$), bismuth selenide ($Bi_2Se_3$), antimony telluride ($Sb_2Te_3$), molybdenum sulfide ($MoS_2$), molybdenum telluride ($MoTe_2$), tungsten sulfide ($WS_2$), and tungsten telluride ($WTe_2$). The topological insulator material may have insulating properties due to a particular crystallographic order, while portions adjacent to a surface thereof generally include a conductive material.

A seed capping layer 166 may include at least one of a non-magnetic metal material, e.g., Cr, Ru, and Ta, and a non-magnetic compound, e.g., cobalt gallium (CoGa) and manganese gallium nitride (MnGaN), and a non-magnetic alloy such as nickel aluminum (NiAl).

As illustrated in FIGS. 1, 2A, and 2A, the magnetic track layer 160 may include a bottom portion 160F extending in a first direction on the reading unit 150, e.g., along the X axis, and a first sidewall portion 160S1, a second sidewall portion 160S2, a third sidewall portion 160S3, and a fourth sidewall portion 160S4 that extend in a third direction, e.g., along the Z axis. The first sidewall portion 160S1 and the second sidewall portion 160S2 may be spaced apart from each other in a first direction, e.g., along the X axis, and the third sidewall portion 160S3 and the fourth sidewall portion 160S4 may be spaced apart from each other in a second direction, e.g., along the Y axis. The first sidewall portion 160S1 and the second sidewall portion 160S2 may be connected to the bottom portion 160F, and the first sidewall portion 160S1, the bottom portion 160F, and the second sidewall portion 160S2 may constitute a track region MTR. Accordingly, the plurality of magnetic domains MD may be continuously arranged in the third direction, e.g., along the Z axis, and the first direction, e.g., along the X axis, in the track region MTR.

A mold structure 170 may be on the bottom portion 160F of the magnetic track layer 160, and may include a plurality of first mold layers 172 and a plurality of second mold layers 174 that are alternately arranged in the third direction, e.g., along the Z axis. The first through fourth sidewall portions 160S1 through 160S4 of the magnetic track layer 160 may surround four sidewalls of the mold structure 170, and a bottom surface of the mold structure 170 may be covered by the bottom portion 160F of the magnetic track layer 160. For example, referring to FIGS. 1-2B, the magnetic track layer 160 may have an open box shape on the reading unit 150, such that the bottom portion 160F may be on the reading unit 150, and the first through fourth sidewall portions 160S1 through 160S4 may extend perpendicularly from the bottom portion 160F along the third direction to define a frame, e.g., four sides, on the bottom portion 160F, e.g., the mold structure 170 may be positioned on the bottom portion 160F inside, e.g., and completely fill, the open box shape of the magnetic track layer 160.

For simplicity of illustration, in FIG. 2A, the mold structure 170 is schematically illustrated as including seven of the first mold layers 172 and six of the second mold layers 174 that are alternately arranged, but the number of first mold layers 172 and second mold layers 174 may be about 10 to about 500, respectively. However, the numbers are not limited thereto.

As illustrated in FIG. 3, the first mold layer 172 may have a first height $h11$ in the third direction, e.g., along the Z axis, and the second mold layer 174 may have a second height $h12$ in the third direction, e.g., along the Z axis. The first height $h11$ may be larger than the second height $h12$. For example, the first height $h11$ may be about 10 nm to about 100 nm, and the second height $h12$ may be about 2 nm to about 50 nm, but embodiments are not limited thereto. A total height of the mold structure 170 may be about 1 micrometer to about 100 micrometers, but is not limited thereto, e.g., a total height of the mold structure 170 may equal a depth of the magnetic track layer 160 measured from a top surface of the bottom portion 160F to top surfaces of the first through fourth sidewall portions 160S1 through 160S4.

The second mold layer 174 may include a material different from that of the first mold layer 172, e.g., the second mold layer 174 may include a material having an etch selectivity with respect to the first mold layer 172. In example embodiments, the first mold layer 172 and the second mold layer 174 may include silicon oxide, silicon nitride, silicon oxynitride, silicon carbon oxide, or metal oxide. For example, the first mold layer 172 may include silicon oxide, and the second mold layer 174 may include silicon nitride.

The mold structure 170 may include a plurality of protrusions 170P on the sidewalls of the mold structure 170. For example, the second mold layer 174 may protrude outwardly with respect to the first mold layer 172, and protruding sidewall portions of the second mold layer 174 may form the plurality of protrusions 170P. For example, as illustrated in FIGS. 2A-3, the second mold layer 174 may extend beyond, e.g., overhang, the first mold layer 172 in each of the first and second direction, e.g., along the X and Y axes.

As exemplarily illustrated in FIG. 3, the bottom portion 160F of the magnetic track layer 160 may include a bottom notch 160FN, and the first through fourth sidewall portions 160S1 through 160S4 may include a plurality of sidewall notches 160SN. For example, as illustrated in FIG. 3, the bottom notch 160FN may be a recess in a center of the bottom portion 160F, and each sidewall notch 160SN may correspond to, e.g., overlap and be complementary with respect to, a respective protrusion 170P of the mold structure 170. The bottom notch 160FN and the plurality of sidewall notches 160SN may correspond to the plurality of magnetic domain walls MDW. In addition, a portion of the magnetic track layer 160 between two adjacent sidewall notches 160SN and a portion of the magnetic track layer 160 between the bottom notch 160FN and the adjacent sidewall notch 160SN may correspond to the plurality of magnetic domains MD. The plurality of magnetic domain walls MDW may be formed at positions of the bottom notches 160FN and the sidewall notches 160SN, and may be moved in the Neel domain wall motion.

The bottom notch 160FN may be referred to as a recess formed in the magnetic track layer 160 in the central region of the bottom portion 160F of the magnetic track layer 160. In other words, the bottom notch 160FN may correspond to a portion of the magnetic track layer 160 in which a top surface of the magnetic track layer 160 is recessed inwardly in the central region of the bottom portion 160F of the magnetic track layer 160. The bottom notch 160FN may be formed in a pointy type, e.g., a shape having a vertex pointing downwardly toward the reading unit 150 along the z axis, at a position where the bottom notch 160FN vertically overlaps the reading unit 150.

The plurality of sidewall notches 160SN may be spaced apart from each other in the third direction in each of the first through fourth sidewall portions 160S1 through 160S4 of the magnetic track layer 160. The plurality of sidewall notches 160SN may be formed at positions corresponding to the protrusions 170P of the mold structure 170. For example, the first sidewall portion 160S1 of the magnetic track layer 160 may contact the mold structure 170, and the plurality of sidewall notches 160SN may be formed in the portion of the first sidewall portion 160S1 in contact with the plurality of protrusions 170P. The plurality of sidewall notches 160SN may correspond to a portion of the first sidewall portion 160S1 in which a surface of the first sidewall portion 160S1 is recessed inwardly in the first direction (e.g., X direction) conforming to the plurality of protrusions 170P. The plurality of sidewall notches 160SN formed in the first and second sidewall portions 160S1 and 160S2 may extend in the second direction (e.g., Y direction), and the plurality of sidewall notches 160SN formed in the third and fourth sidewall portions 160S3 and 160S4 may extend in the first direction (e.g., X direction).

Selectively, a side SOT inducing layer 182 and a capping layer 184 may be sequentially arranged on each of the first through fourth sidewall portions 160S1 through 160S4. The side SOT inducing layer 182 may include at least one non-magnetic metal material of, e.g., W, Pt, Ta, Hf, Re, Ir, Au, Ag, Ti, and Cu. The capping layer 184 may include at least one of a non-magnetic metal material, e.g., Cr, Ru, and Ta, a non-magnetic compound, e.g., CoGa and MnGaN, and a non-magnetic alloy, e.g., NiAl.

As illustrated in FIG. 2B, an insulating spacer 186 may be formed between two sidewalls extending in the second direction (e.g., Y direction) of the first mold layer 172 and the third and fourth sidewall portions 160S3 and 160S4 of the magnetic track layer 160. The insulating spacer 186 may be between the bottom portion 160F and the third sidewall portion 160S3 of the magnetic track layer 160, and between the bottom portion 160F and the fourth sidewall portion 160S4 of the magnetic track layer 160. Thus, the plurality of magnetic domains MD formed in the track range MTR may be prevented from unnecessarily extending toward the third and fourth sidewall portions 160S3 and 160S4, and the magnetic domain wall MDW may be prevented from unnecessarily moving toward the third and fourth sidewall portions 160S3 and 160S4. Accordingly, the movement of the magnetic domain wall MDW may be limited within the first sidewall portion 160S1, the bottom portion 160F, and the second sidewall portion 160S2 in the first direction (X direction) and the third direction (Z direction).

In FIG. 2B, it is exemplarily illustrated that the insulating spacer 186 includes a top surface at the same level as a top surface of the lowermost first mold layer 172 among the plurality of first mold layers 172, and is formed only on the sidewalls of the lowermost first mold layer 172. Unlike this case, the insulating spacer 186 may extend to a height greater than illustrated in FIG. 2B to include a top surface at a level higher than the top surface of the lowermost first mold layer 172.

In a manufacturing process according to example embodiments, after the bottom portion 160F of the magnetic track layer 160 is first formed, the mold structure 170 may be formed on the bottom portion 160F, and the first through fourth sidewall portions 160S1 through 160S4 of the magnetic track layer 160 may be formed on the sidewalls of the mold structure 170, thereby forming the magnetic track layer 160. In this manufacturing process, the bottom portion 160F may be formed to include the bottom notch 160FN, and the first through fourth sidewall portions 160S1 through 160S4 may be formed to include the sidewall notches 160SN.

As illustrated in FIG. 3, the seed capping layer 166 may include a first seed capping layer portion 166P1 in contact with the bottom surface of the mold structure 170 and a second seed capping layer portion 166P2 in contact with the sidewalls of the mold structure 170, and the first seed capping layer portion 166P1 and the second seed capping layer portion 166P2 may be formed in different processes. For example, after the first seed capping layer portion 166P1 is formed first, the mold structure 170 may be formed, and thereafter, the second seed capping layer portion 166P2 may be formed. In addition, the SOT inducing layer 164 may include a first SOT inducing layer portion 164P1 in contact with the bottom surface of the first seed capping layer portion 166P1, and a second SOT inducing layer portion 164P2 in contact with the sidewall of the second seed capping layer portion 166P2. The free layer 162 may include a first free layer portion 162P1 in contact with the first SOT inducing layer portion 164P1, and a second free layer portion 162P2 in contact with a sidewall of the second SOT inducing layer portion 164P2. Similarly, the first SOT inducing layer portion 164P1 and the second SOT inducing layer portion 164P2 may be formed in different processes, and the first free layer portion 162P1 and the second free layer portion 162P2 may be formed in different processes.

The fourth insulating layer 148 may be on the third insulating layer 146 to surround the magnetic track layer 160, and an etch stop layer 192 may be on the fourth insulating layer 148 to cover the top surface of the magnetic track layer 160. A first top insulating layer 194 and a second top insulating layer 196 may be on the etch stop layer 192 and penetrate the first top insulating layer 194 and the etch stop layer 192 so that the write contact 198 is connected to the magnetic track layer 160. The write contact 198 may be on the first sidewall portion 160S1.

In general, in a racetrack-type magnetic memory device that stores data by using a magnetic domain wall movement, integration intensity may be improved by employing a racetrack extending in a vertical direction. However, in this case, it may be difficult to control a stable magnetic domain wall movement. That is, while a physical notch may be imprinted horizontally to stabilize the magnetic domain wall movement, it may be difficult to form a plurality of notches at a constant interval on the racetrack along the vertical direction.

In contrast, according to the example embodiments described above, the magnetic track layer 160 may have a three-dimensional (3D) structure including the bottom portion 160F with the bottom notch 160FN, the mold structure 170 including the plurality of protrusions 170P on the bottom portion 160F, and the first through fourth sidewall portions 160S1 through 160S4 connected to the bottom portion 160F and on the sidewalls of the mold structure 170. Since the magnetic track layer 160 includes the sidewall notches 160SN and the bottom notch 160FN, stable magnetic domain wall movement may be possible due to the magnetic track layer 160 having a 3D structure. Thus, the magnetic memory device 100 may easily adjust the magnetic domain wall movement, and at the same time, improve the integration intensity.

Figure 4:
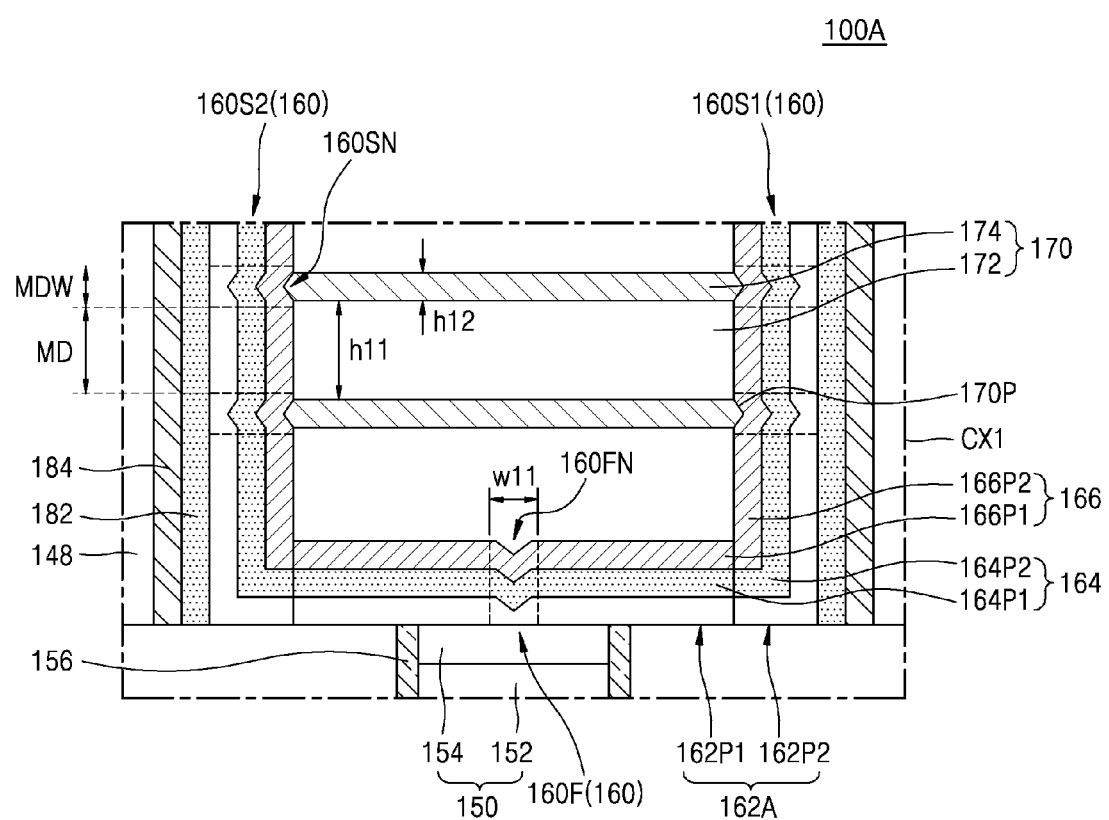
FIG. 4 illustrates a cross-sectional view of a magnetic memory device according to example embodiments.

FIG. 4 is a cross-sectional view of a magnetic memory device 100A according to example embodiments. FIG. 4 is an enlarged cross-sectional view of a region corresponding to the region CX1 in FIG. 2A. In FIG. 4, the same reference numerals as those in FIGS. 1 through 3 denote the same components.

Referring to FIG. 4, a free layer 162A may include at least one of a vertical magnetic material, a vertical magnetic material having an $L1_0$ structure, a CoPt alloy having a hexagonal close-packed lattice structure, and a vertical stacked structure. The vertical magnetic material may include at least one of, e.g., Fe, Ni, Pt, Pd, B, Ta, W, Ir, and Co, and may include at least one of, e.g., CoFeB, CoFeTb, CoFeGd, and CoFeDy. For example, the vertical magnetic material having the $L1_0$ structure may include at least one of, e.g., $Fe_{50}Pt_{50}$, $Fe_{50}Pd_{50}$, $Co_{50}Pt_{50}$, $Co_{50}Pd_{50}$, and $Fe_{50}Ni_{50}$. The vertical stacked structure may include a stacked structure including ferromagnetic layers alternately and repeatedly stacked, or a stacked structure including ferromagnetic and nonmagnetic layers alternately and repeatedly stacked. For example, the vertical stacked structure may include at least one of, e.g., the (Co/Pt)n stacked structure, the (CoFe/Pt)n stacked structure, the (CoFe/Pd)n stacked structure, the (Co/Pd)n stacked structure, the (Co/Ni)n stacked structure, the (CoNi/Pt)n stacked structure, the (CoCr/Pt)n stacked structure, and the (CoCr/Pd)n stacked structure (here, n is a natural number).

Figure 5:
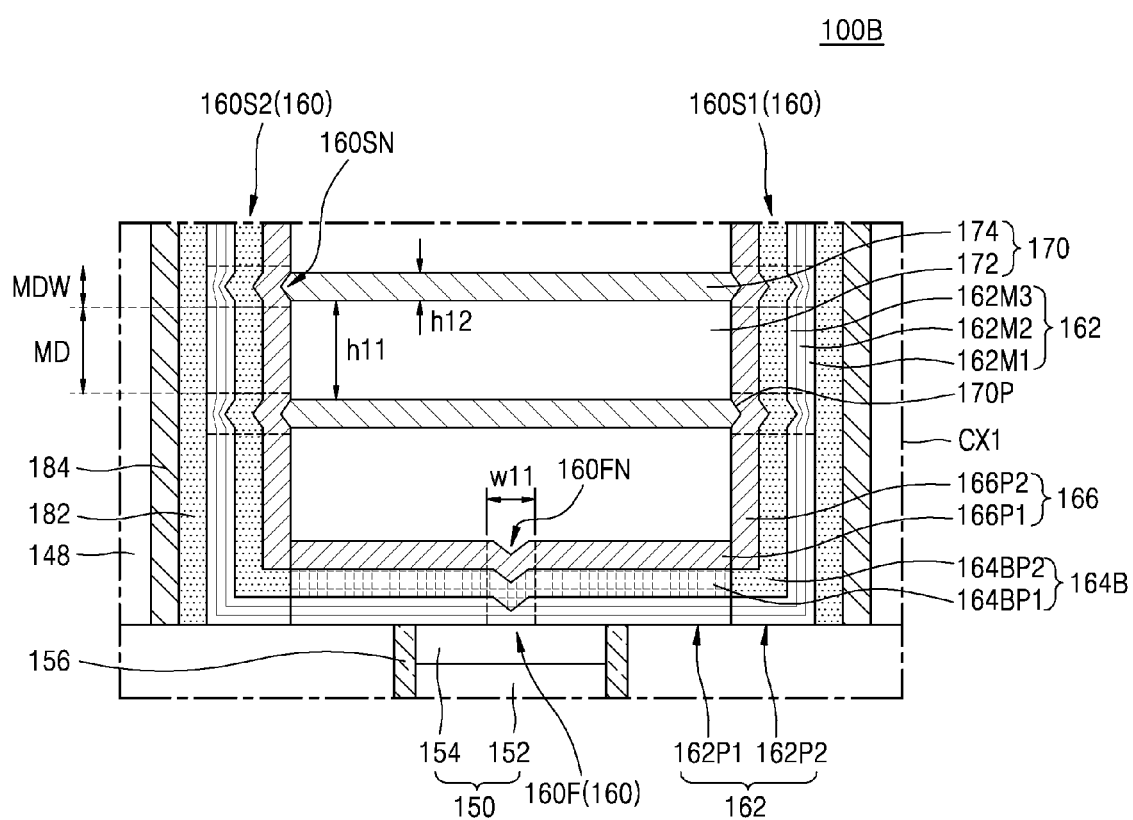
FIG. 5 illustrates a cross-sectional view of a magnetic memory device according to example embodiments.

FIG. 5 is a cross-sectional view of a magnetic memory device 100B according to example embodiments. FIG. 5 is an enlarged cross-sectional view of a region corresponding to the region CX1 in FIG. 2A. In FIG. 5, the same reference numerals as those in FIGS. 1 through 4 denote the same components.

Referring to FIG. 5, a SOT inducing layer portion 164B may include a first SOT inducing layer portion 164BP1 and a second SOT inducing layer portion 164BP2, and the first SOT inducing layer portion 164BP1 may include a material different from that of the second SOT inducing layer portion 164BP2. At least one of the first SOT inducing layer portion 164BP1 and the second SOT inducing layer portion 164BP2 may include at least one non-magnetic metal material, e.g., W, Pt, Ta, Hf, Re, Ir, Au, Ag, Ti, and Cu. In addition, at least one of the first SOT inducing layer portion 164BP1 and the second SOT inducing layer portion 164BP2 may include at least one topological insulating material of, e.g., bismuth telluride ($Bi_2Te_3$), bismuth selenide ($Bi_2Se_3$), antimony telluride ($Sb_2Te_3$), and molybdenum sulfide ($MoS_2$), molybdenum telluride ($MoTe_2$), tungsten sulfide ($WS_2$), and tungsten telluride ($WTe_2$).

In some example embodiments, the first SOT inducing layer portion 164BP1 may include a material having a greater spin Hall angle than that of the second SOT inducing layer portion 164BP2. For example, the free layer 162 (that is, the second free layer portion 162P2) in the first through fourth sidewall portions 160S1 through 160S4 may facilitate the magnetic domain wall movement due to the side SOT inducing layer 182 and the second SOT inducing layer portion 164BP2, and the free layer 162 (that is, the first free layer portion 162P1) in the bottom portion 160F may facilitate the magnetic domain wall movement due to the first SOT inducing layer portion 164BP1 having a relatively large spin Hall angle.

In other example embodiments, the first SOT inducing layer portion 164BP1 may include the same material as the second SOT inducing layer portion 164BP2, but the first SOT inducing layer portion 164BP1 may have better crystal characteristics than the second SOT inducing layer portion 164BP2. However, embodiments are not limited thereto.

In other example embodiments, the first SOT inducing layer portion 164BP1 may be formed by using the above-described topological insulating material by using a molecular beam epitaxy (MBE) process, a chemical vapor deposition (CVD) process, or a physical vapor deposition (PVD) process, and the second SOT inducing layer portion 164BP2 may be formed by using the non-magnetic metal material described above by using an atomic layer deposition (ALD) process.

Figure 6:
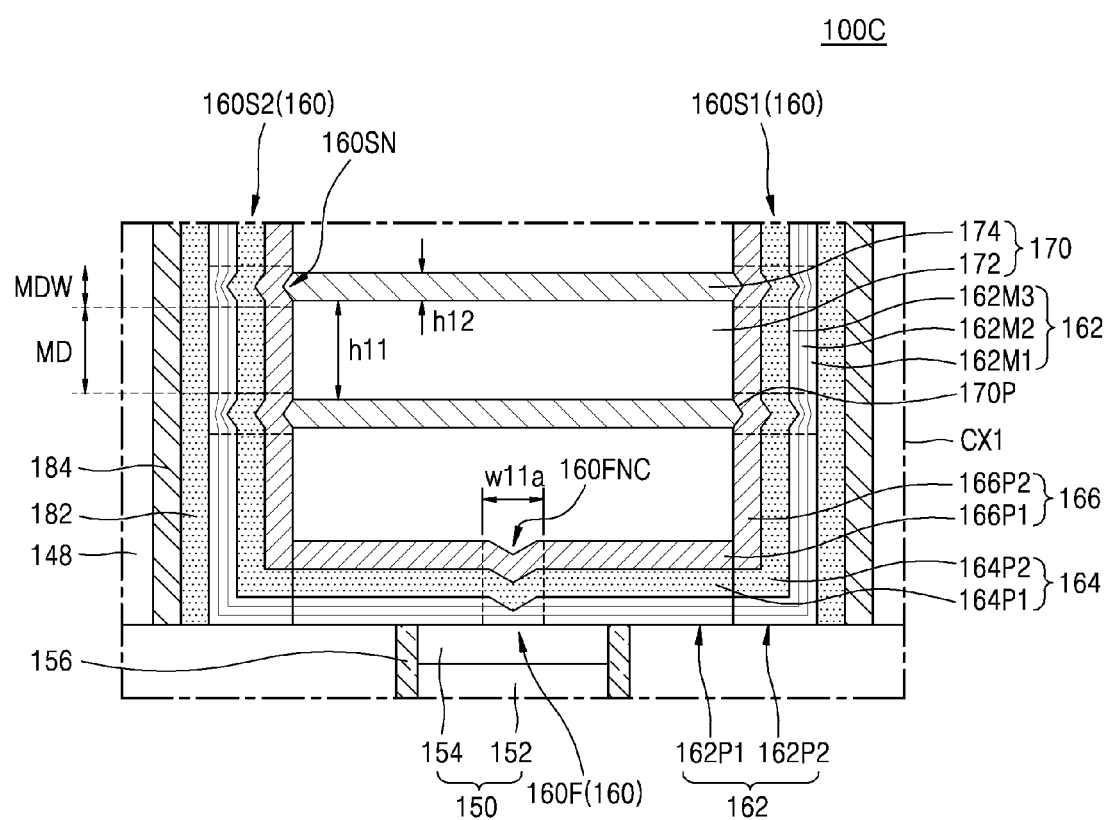
FIG. 6 illustrates a cross-sectional view of a magnetic memory device according to example embodiments.

FIG. 6 is a cross-sectional view of a magnetic memory device 100C according to example embodiments. FIG. 6 is an enlarged cross-sectional view of a region corresponding to the region CX1 in FIG. 2A. In FIG. 6, the same reference numerals as those in FIGS. 1 through 5 denote the same components.

Referring to FIG. 6, the sidewall notch 160SN may have a width corresponding to a thickness in the third direction (e.g., Z direction) of the second mold layer 174 (e.g., the second height h12). A bottom notch 160FNC may have a first width w11a, and the first width w11a may be greater than the second height h12. In addition, the first width w11a of the bottom notch 160FNC may be greater than the first width w11 of the bottom notch 160FN illustrated in FIG. 3. To assist the stable magnetic domain wall MDW movement in the first through fourth sidewall portions 160S1 through 160S4 and the bottom portion 160F of the magnetic track layer 160, the bottom notch 160FNC in the bottom portion 160F may be formed large.

Figure 7:
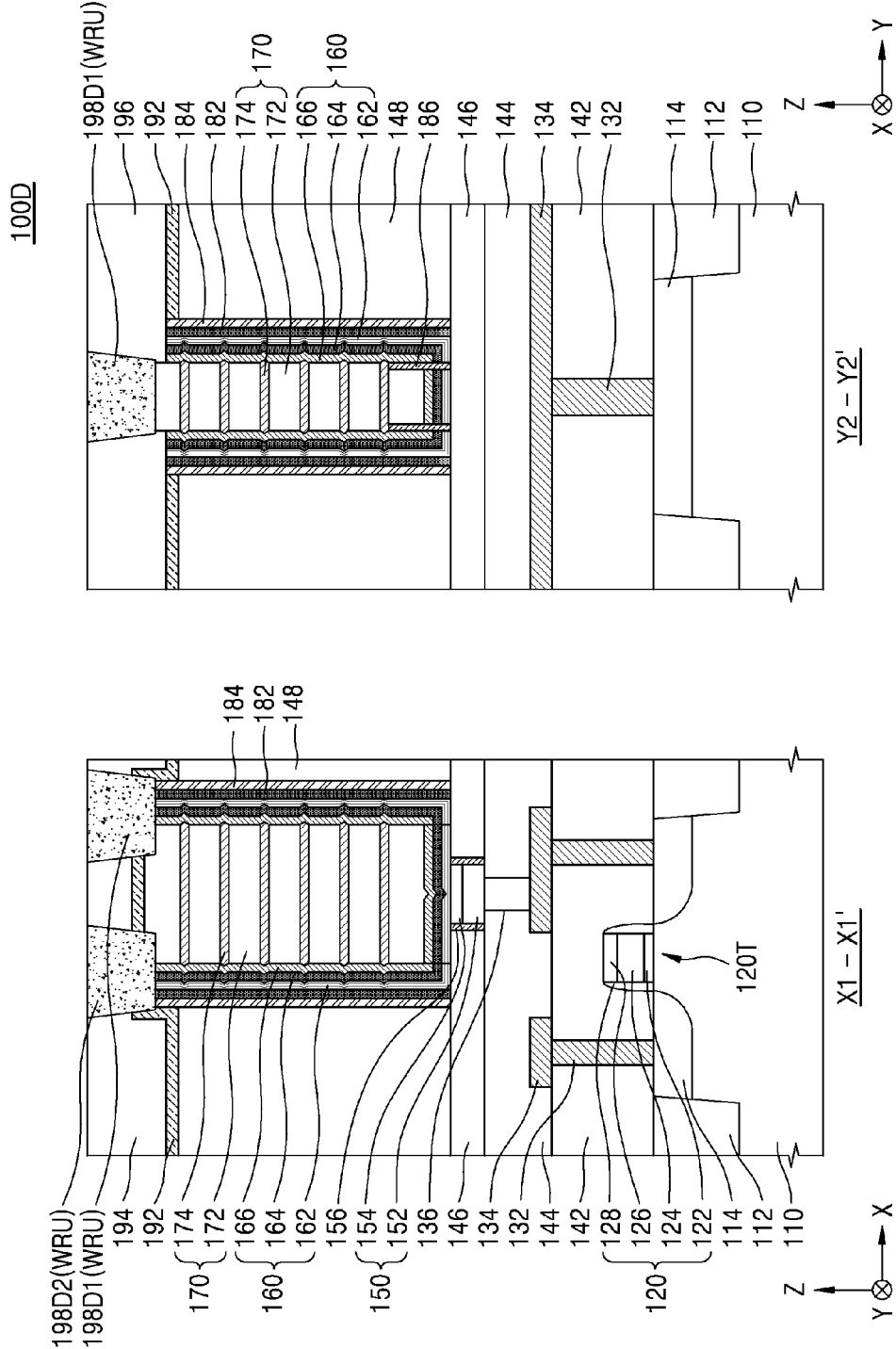
FIG. 7 illustrates cross-sectional views of a magnetic memory device according to example embodiments.

FIG. 7 illustrates cross-sectional views of a magnetic memory device 100D according to example embodiments. FIG. 7 illustrates cross-sectional views of portions corresponding to lines X1-X1' and Y2-Y2' in FIG. 1, respectively. In FIG. 7, the same reference numerals as those in FIGS. 1 through 6 denote the same components.

Referring to FIG. 7, a first write contact 198D1 may be on the first sidewall portion 160S1, and a second write contact 198D2 may be on the second sidewall portion 160S2. The pulse current may be sequentially applied to the plurality of magnetic domains MD via the first write contact 198D1 and the second write contact 198D2, and each of the plurality of magnetic domains MD may have a certain magnetic moment direction or a certain magnetization direction. In addition, the magnetic domain wall MDW may be moved by applying the pulse current to the magnetic track layer 160 from a domain wall movement device via at least one of the first write contact 198D1 and the second write contact 198D2.

FIGS. 8 through 15, 16a through 16c, 17 through 19, 20a, 20b, 21, 22a, 22b, and 23 through 28 are cross-sectional views illustrating stages in a method of manufacturing the magnetic memory device 100, according to example embodiments.

Figure 8:
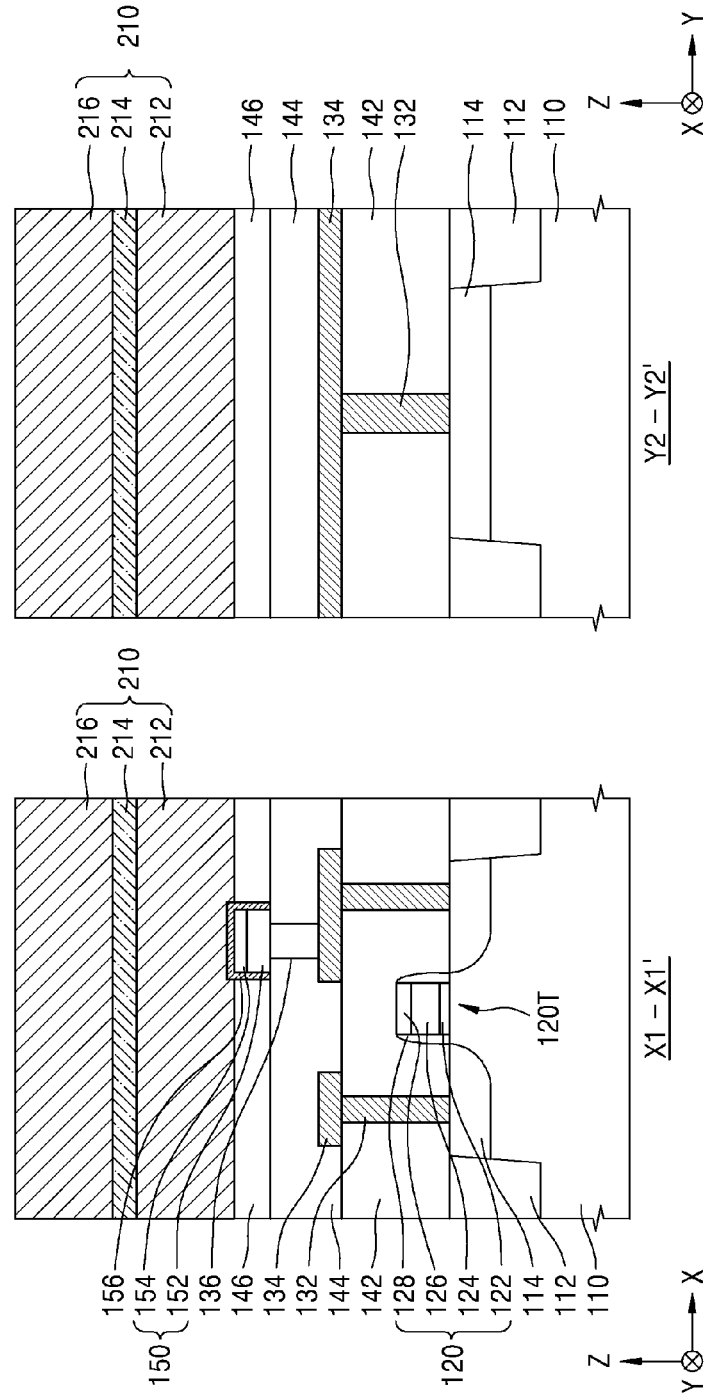

Referring to FIG. 8, the switching element 120T may be formed on the substrate 110, and then, the contact 132, the wiring layer 134, the bottom electrode 136, which are connected to the switching element 120T, and the first and second insulating layers 142 and 144 that surround the contact 132, the wiring layer 134, and the bottom electrode 136 may be formed.

Next, a fixed layer material layer and a tunnel barrier material layer may be formed on the second insulating layer 144, and the tunnel barrier material layer and the pinned layer material layer may be patterned to form the reading unit 150 including the fixed layer 152 and the tunnel barrier layer 154. The spacer 156 covering the top surface and the side surface of the reading unit 150 and the third insulating layer 146 surrounding the sidewall of the reading unit 150 may be further formed.

A sacrificial stack 210 may be formed on the third insulating layer 146 and the spacer 156. The sacrificial stack 210 may include a first sacrificial layer 212, an etch stop layer 214, and a second sacrificial layer 216. The etch stop layer 214 may be formed by using a material having an etch selectivity with respect to the first sacrificial layer 212 and the second sacrificial layer 216. For example, the first sacrificial layer 212 and the second sacrificial layer 216 may include silicon oxide, and the etch stop layer 214 may include silicon nitride, but are not limited thereto.

Figure 9:
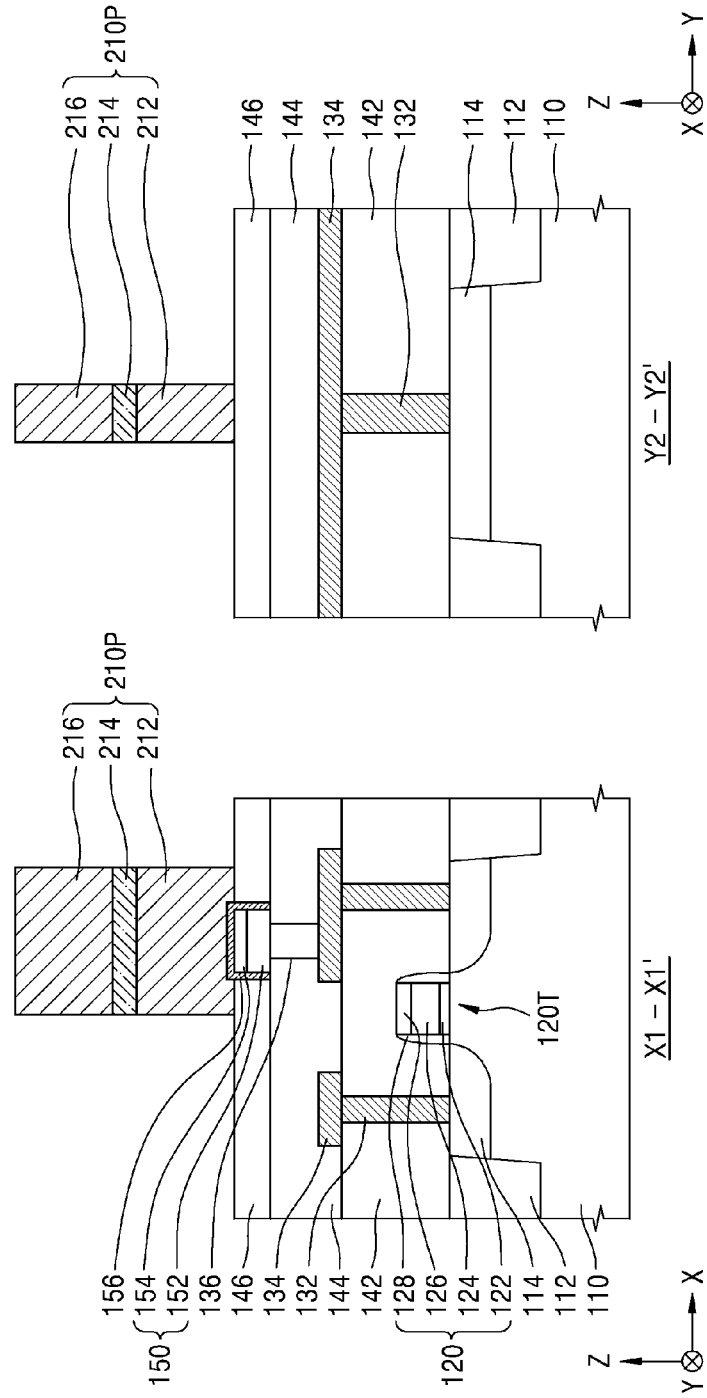

Referring to FIG. 9, a mask pattern may be formed on the sacrificial stack 210, and a sacrificial layer structure 210P may be formed by using the mask pattern as an etching mask and by patterning the sacrificial stack 210. The sacrificial layer structure 210P may cover the top surface of the spacer 156 at a position vertically overlapping the reading unit 150.

Figure 10:
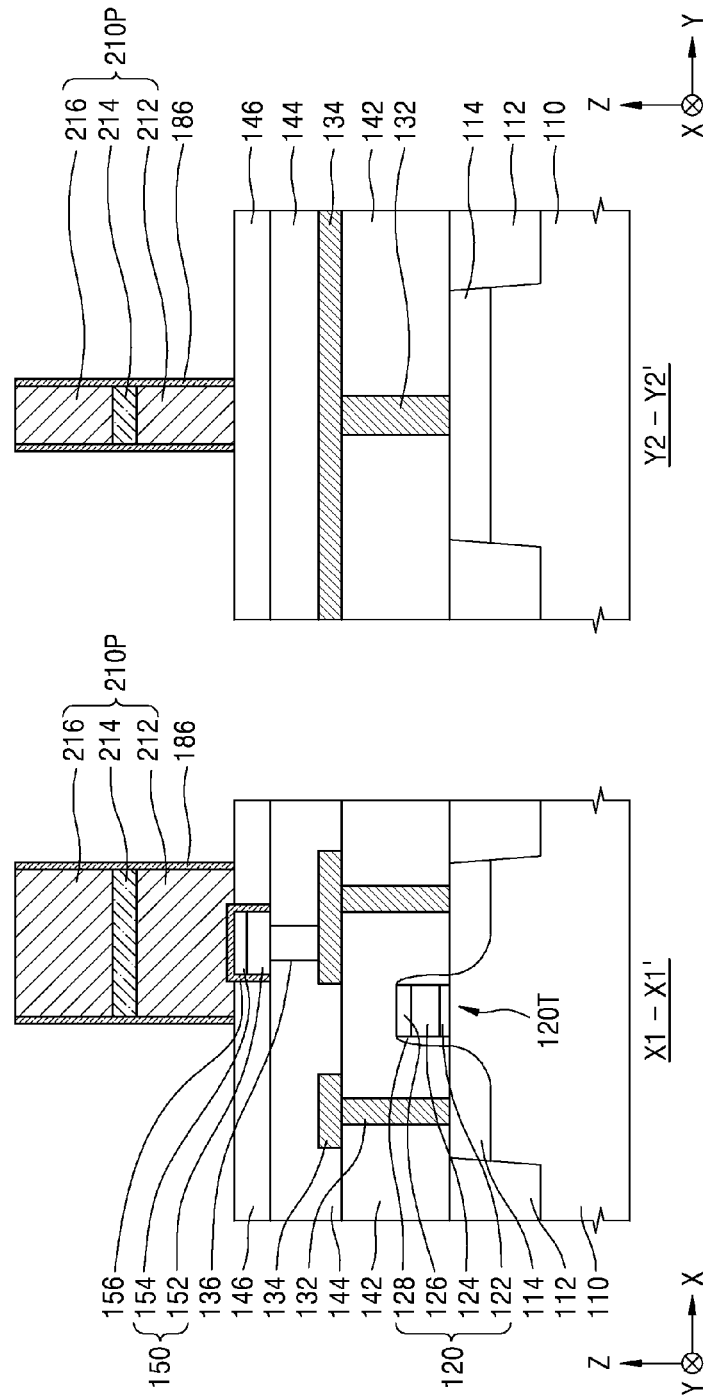

Referring to FIG. 10, an insulating layer may be formed on sidewalls of the sacrificial layer structure 210P, and the insulating spacer 186 may be formed by performing an anisotropic etching process on the insulating layer. The insulating spacer 186 may be formed with a certain thickness on the four sidewalls of the sacrificial layer structure 210P.

Figure 11:
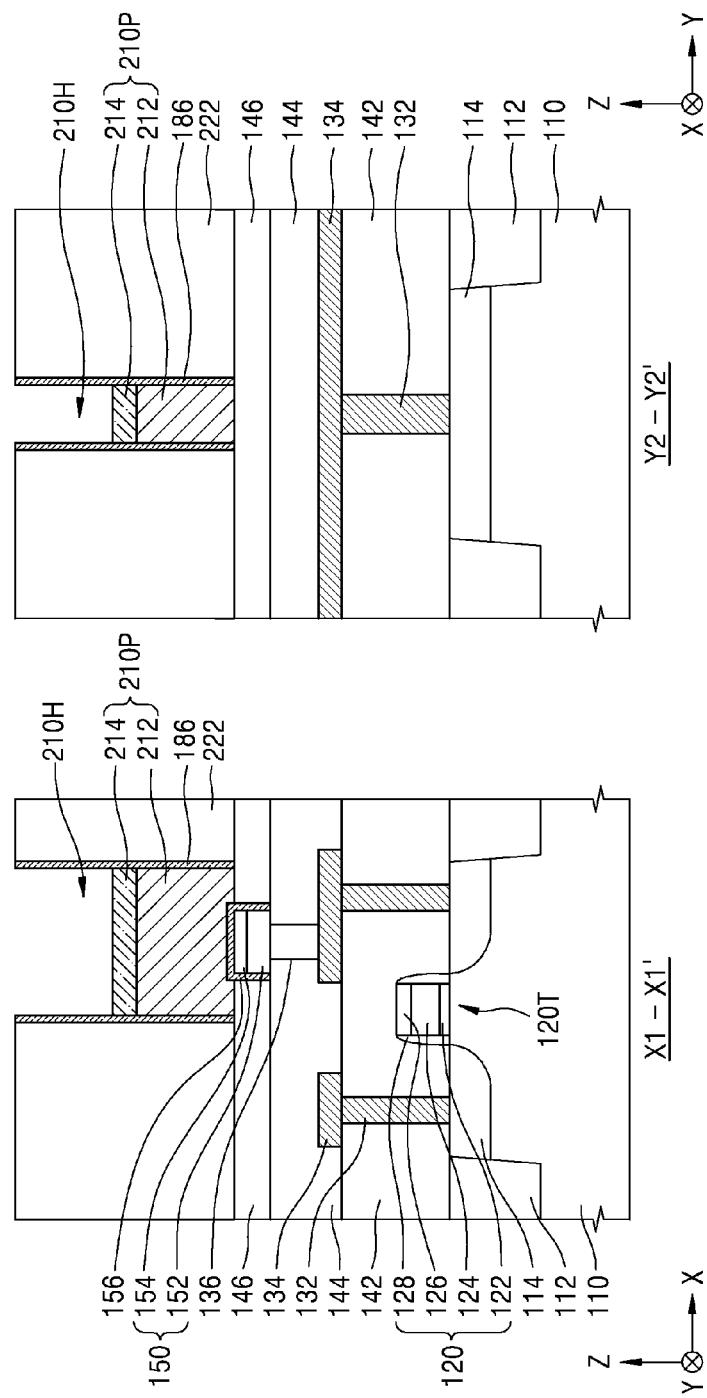

Referring to FIG. 11, an insulating layer may be formed on the third insulating layer 146 and a first buried layer 222 may be formed by removing a top portion of the insulating layer so that a top surface of the sacrificial layer structure 210P is exposed. Next, an opening 210H may be formed by removing the second sacrificial layer 216.

Figure 12:
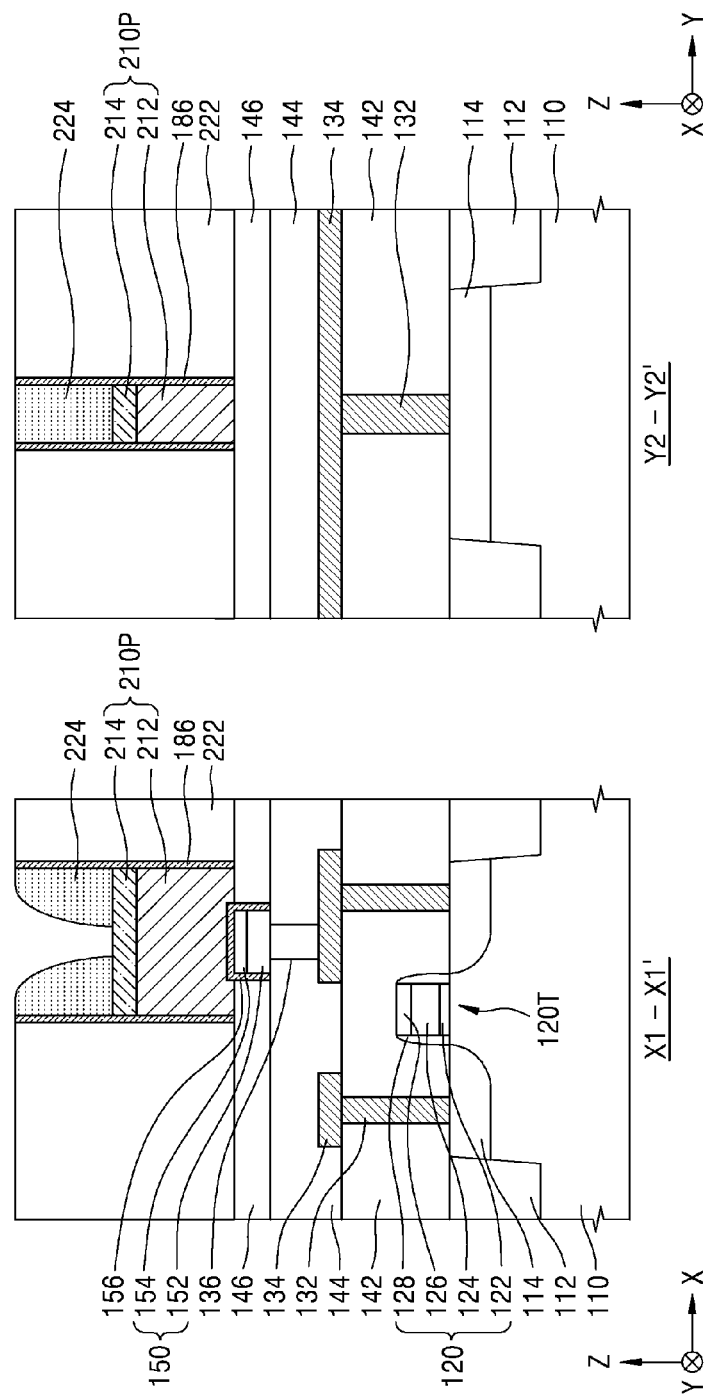

Referring to FIG. 12, an insulating layer partially filling the inside of the opening 210H may be formed on the first buried layer 222, and a pair of wing portions 224 may be formed in the opening 210H by performing an anisotropic etching process on the insulating layer. For example, the pair of wing portions 224 may include silicon nitride.

Figure 13:
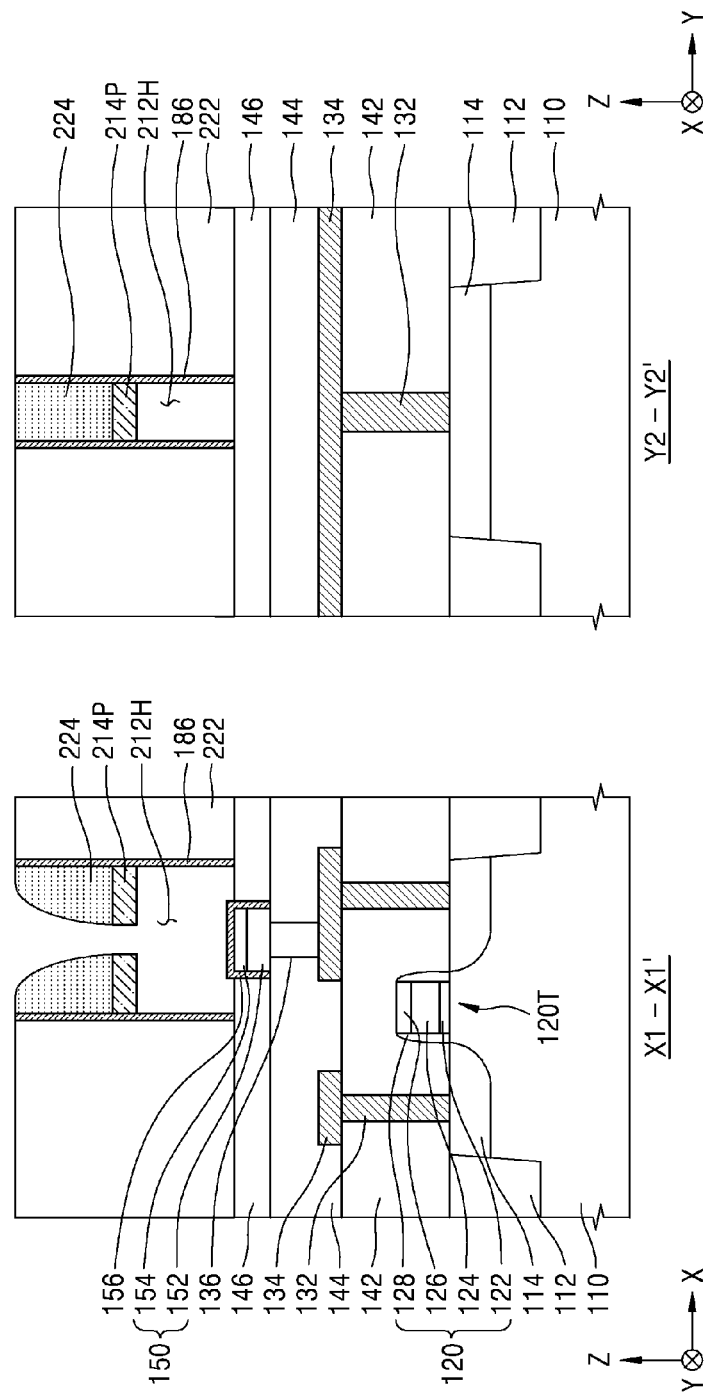

Referring to FIG. 13, an etch stop layer pattern 214P may be formed by removing a portion of the etch stop layer 214 that is not covered by the pair of wing portions 224. Next, an opening 212H may be formed by removing the first sacrificial layer 212 through the pair of wing portions 224 and the etch stop layer pattern 214P, and the top surface of the spacer 156 may be exposed at a bottom of the opening 212H.

Figure 14:
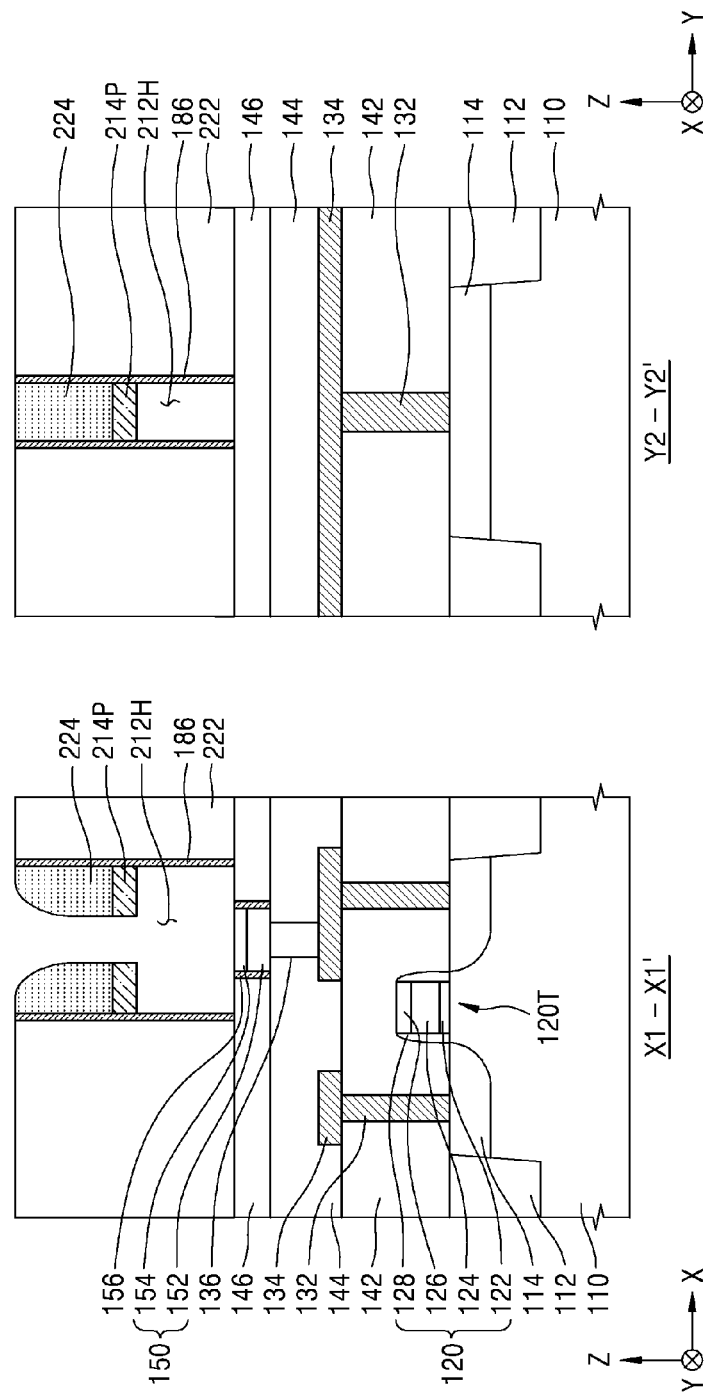
Figure 15:
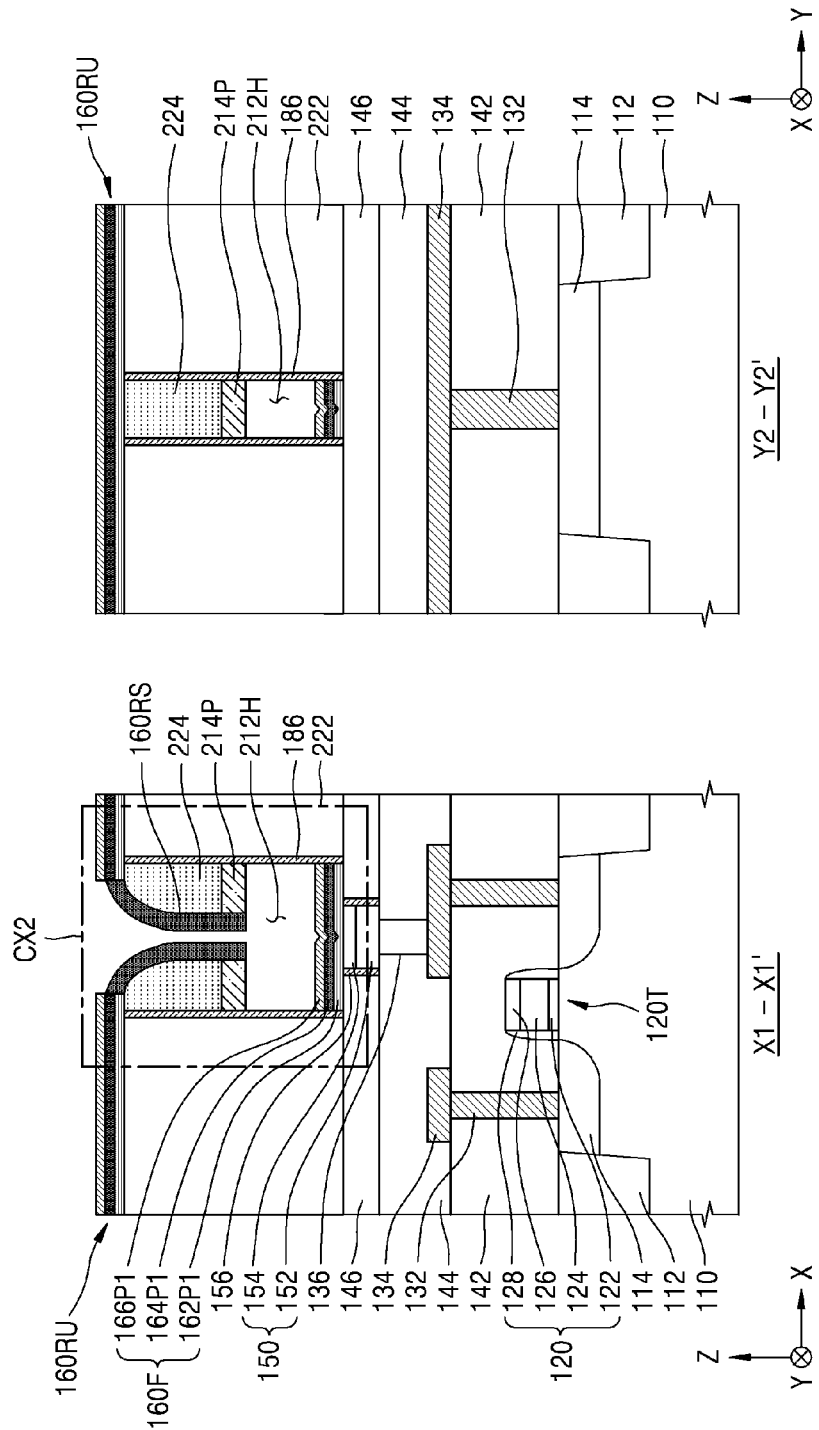

Referring to FIG. 14, a top surface of the tunnel barrier layer 154 may be exposed by removing the portion of the spacer 156 exposed at the bottom of the opening 212H.

Figure 16A:
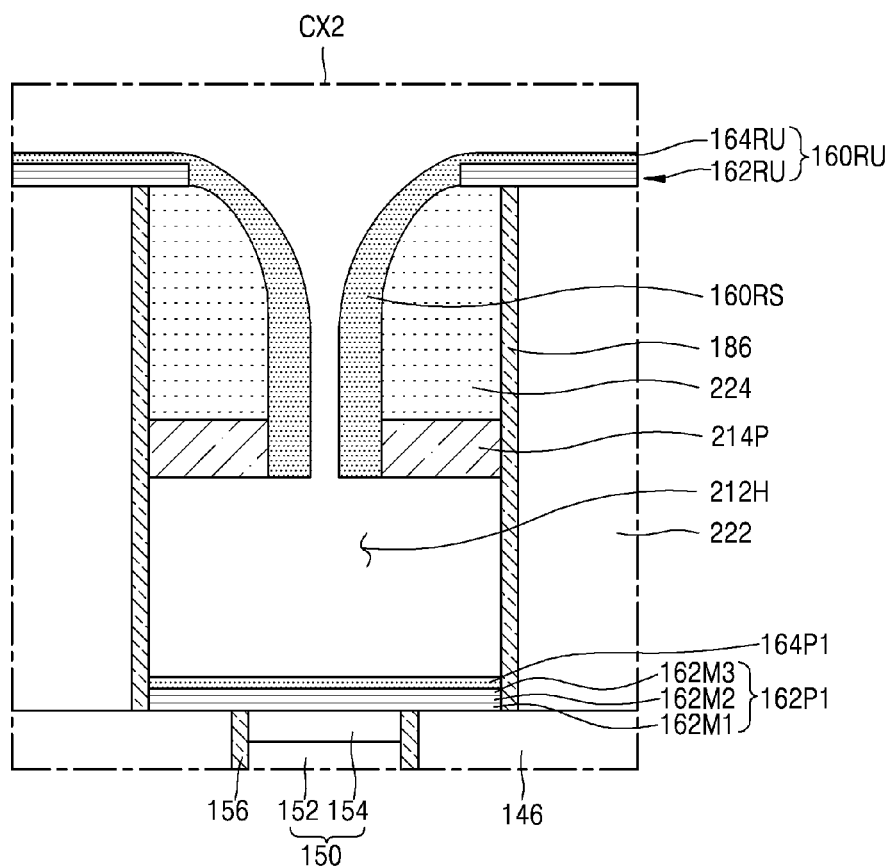
Figure 16B:
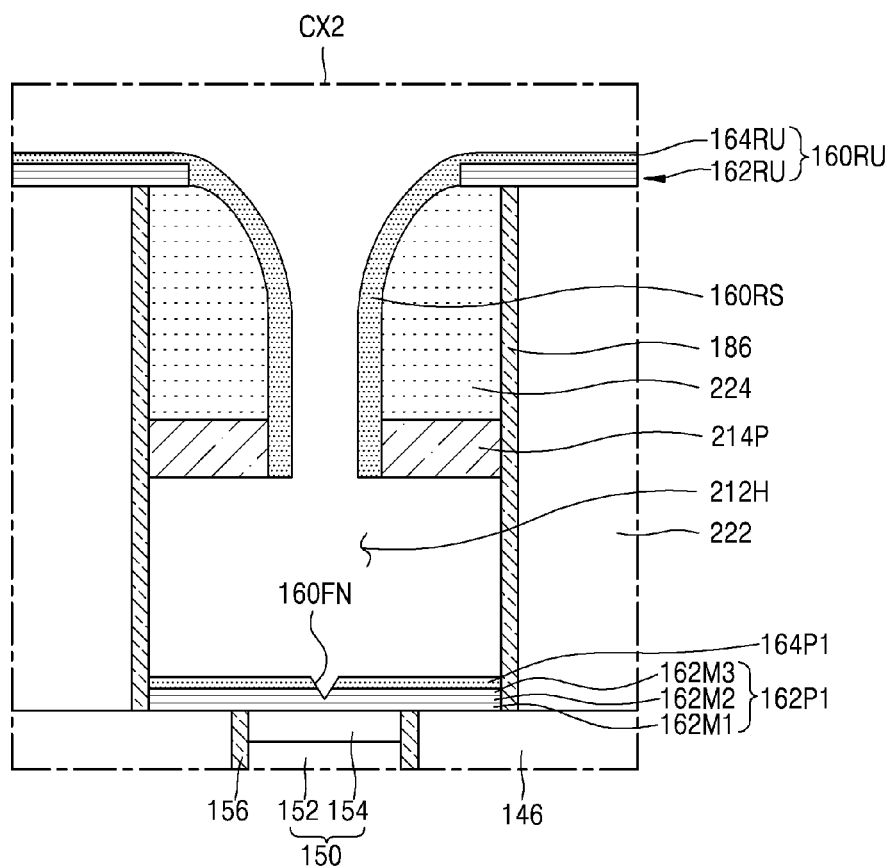
Figure 16C:
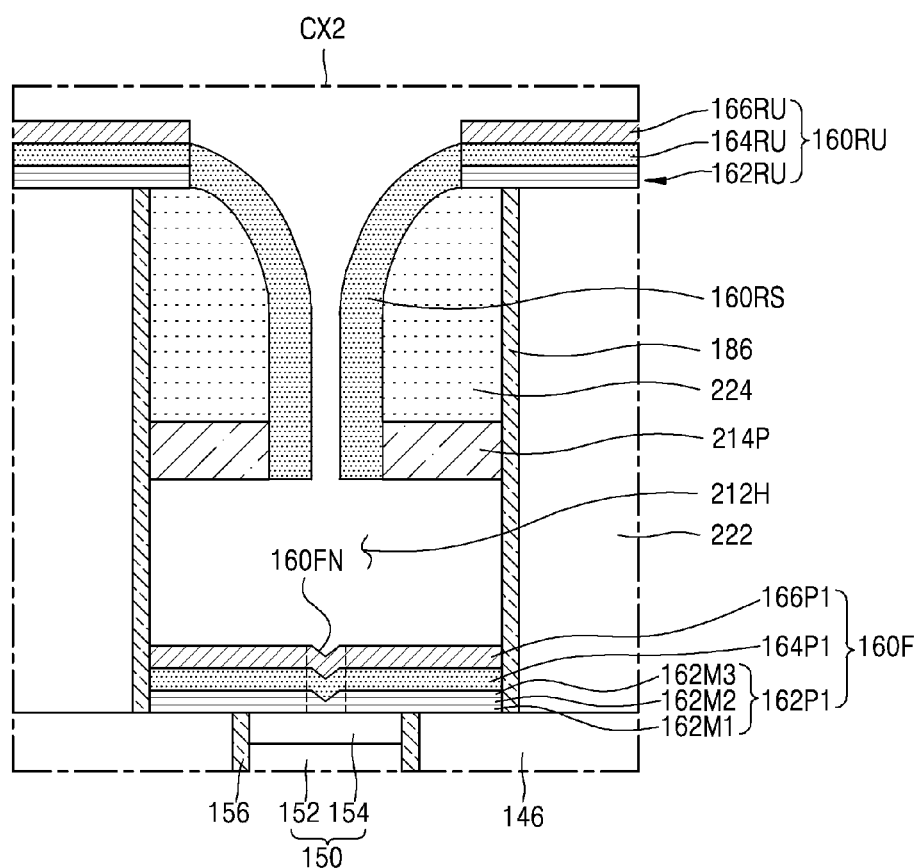

Referring to FIGS. 15 and 16A through 16C, the bottom portion 160F of the magnetic track layer 160 may be formed at the bottom of the opening 212H. Here, FIGS. 16A through 16C are enlarged cross-sectional views illustrating region CX2 in FIG. 15 according to a process order of forming the bottom portion 160F.

First, referring to FIG. 16A, the first free layer portion 162P1 is formed by sequentially forming the first material layer 162M1, the second material layer 162M2, and the third material layer 162M3 at the bottom of the opening 212H. In this case, the first material layer 162M1, the second material layer 162M2, and the third material layer 162M3 may be sequentially formed on a top surface of the first buried layer 222, and accordingly, a free layer material layer 162RU may remain.

Next, the first SOT inducing layer portion 164P1 may be formed at the bottom of the opening 212H, and at this time, the SOT inducing layer material layer 164RU may remain on the top surface of the first buried layer 222. In this case, the free layer material layer 162RU and the SOT inducing layer material layer 164RU on the top surface of the first buried layer 222 may be referred to as a top surface residue 160RU.

In example embodiments, a process of forming the first free layer portion 162P1 and the first SOT inducing layer portion 164P1 may include at least one of the CVD process, the PVD process, and the evaporation process.

In the process of forming the first free layer portion 162P1 and the first SOT inducing layer portion 164P1, metal materials constituting the first free layer portion 162P1 and the first SOT inducing layer portion 164P1 may also be deposited or attached to the pair of wing portions 224. Accordingly, a sidewall residue 160l6 may remain on the pair of wing portions 224, and a width of an inlet of the opening 212H may be further narrowed by the sidewall residue 160l6.

Referring to FIG. 16B, the bottom notch 160FN may be formed by removing portions of the first free layer portion 162P1 and the first SOT inducing layer portion 164P1 through a space exposed by the pair of wing portions 224 and the sidewall residue 160l6. The top surface of the first free layer portion 162P1 may be exposed by the formation of the bottom notch 160FN, and the exposed top surface of the first free layer portion 162P1 may also be recessed by a certain depth in the vertical direction. In the process of forming the bottom notch 160FN, a portion of the sidewall residue 160l6 may be removed together, and thus, the width of the inlet of the opening 212H may be increased again.

In example embodiments, the process of forming the bottom notch 160FN may include a dry etching process, an ion beam etching process, or a plasma etching process, but is not limited thereto.

Referring to FIG. 16C, the first SOT inducing layer portion 164P1 may be further formed to a certain thickness so that the exposed top surface of the first free layer portion 162P1 may be completely covered by the SOT inducing layer portion 164P1. Next, the first seed capping layer portion 166P1 may be formed on the first SOT inducing layer portion 164P1, and at this time, a seed capping layer material layer 166RU may also remain on the top surface of the first buried layer 222. As a result, the bottom portion 160F may be formed in the opening 212H.

Figure 17:
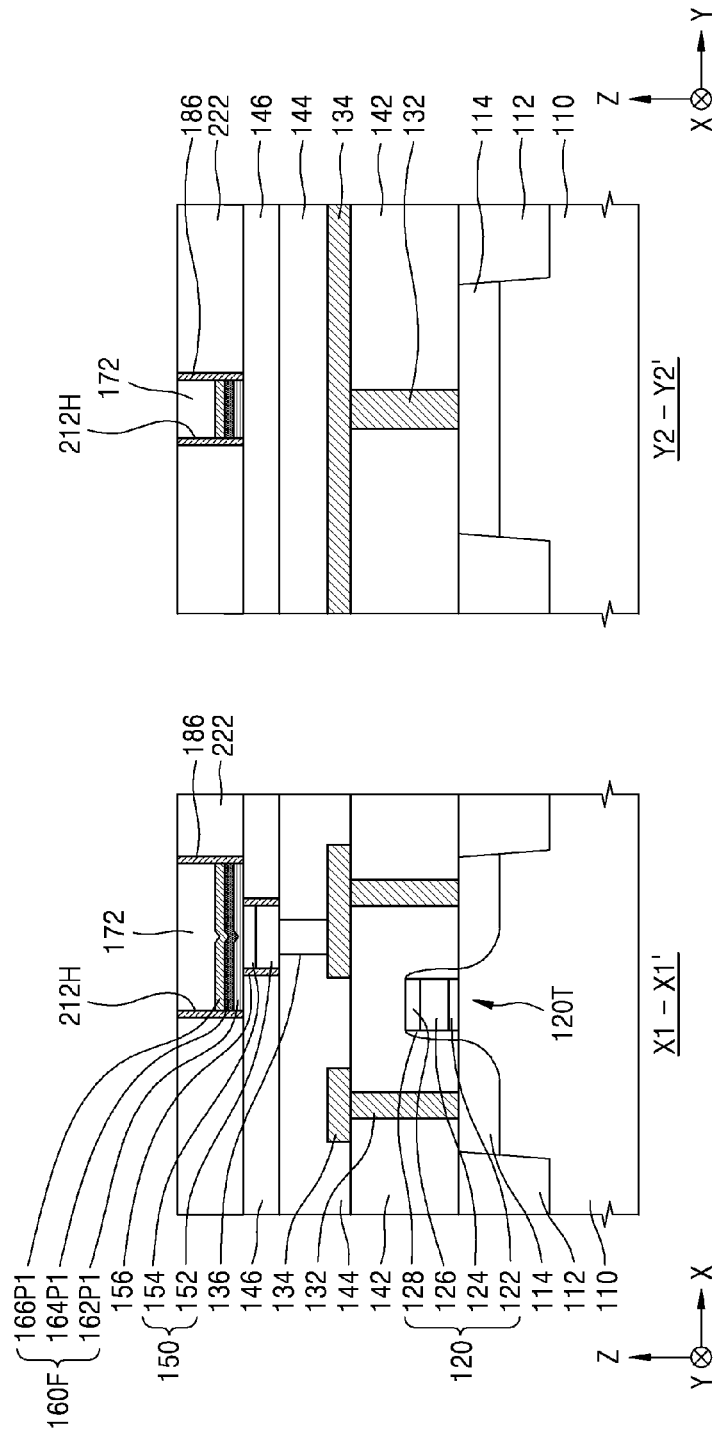

Referring to FIG. 17, the first mold layer 172 may be formed in the opening 212H by filling the inside of the opening 212H (for example, empty spaces in the pair of wing portions 224 and the sidewall residue 16016) with an insulating material and by planarizing a top surface of the insulating material by using an etch back process or a CMP process so that the top surface of the first buried layer 222 is exposed.

Next, the top portions of the pair of wing portions 224, the sidewall residue 16016, and the first buried layer 222 may be removed by an etch back process or a CMP process. In this case, the top side of the insulating spacer 186 may also be removed, and accordingly, a height of the insulating spacer 186 may also be reduced.

Figure 18:
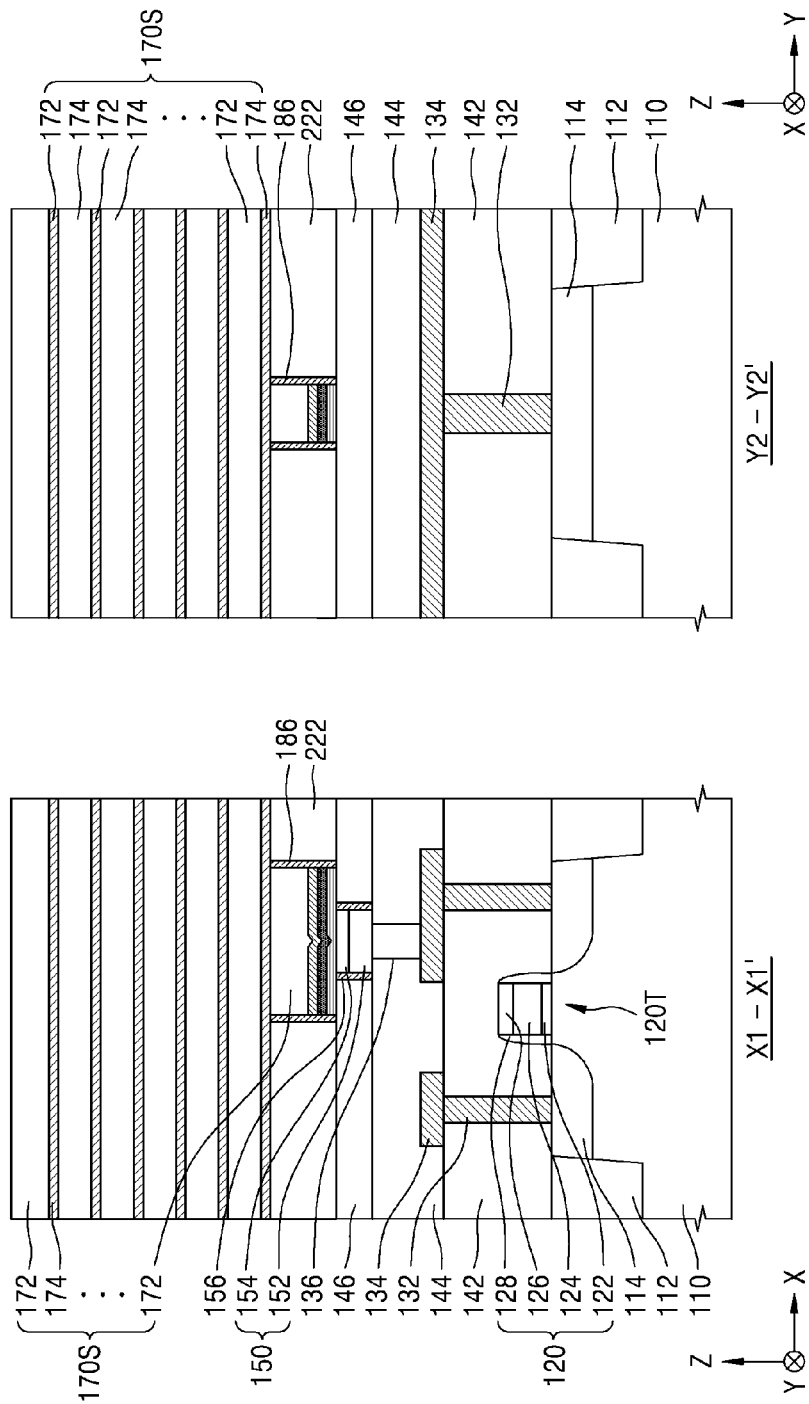

Referring to FIG. 18, a mold stack 170S alternately including a plurality of first mold layers 172 and a plurality of second mold layers 174 may be formed on the first buried layer 222. The first mold layer 172 and the second mold layer 174 may be formed by using materials having etch selectivity with respect to each other. For example, the first mold layer 172 and the second mold layer 174 may include silicon oxide, silicon nitride, silicon oxynitride, silicon carbon oxide, or metal oxide.

Figure 19:
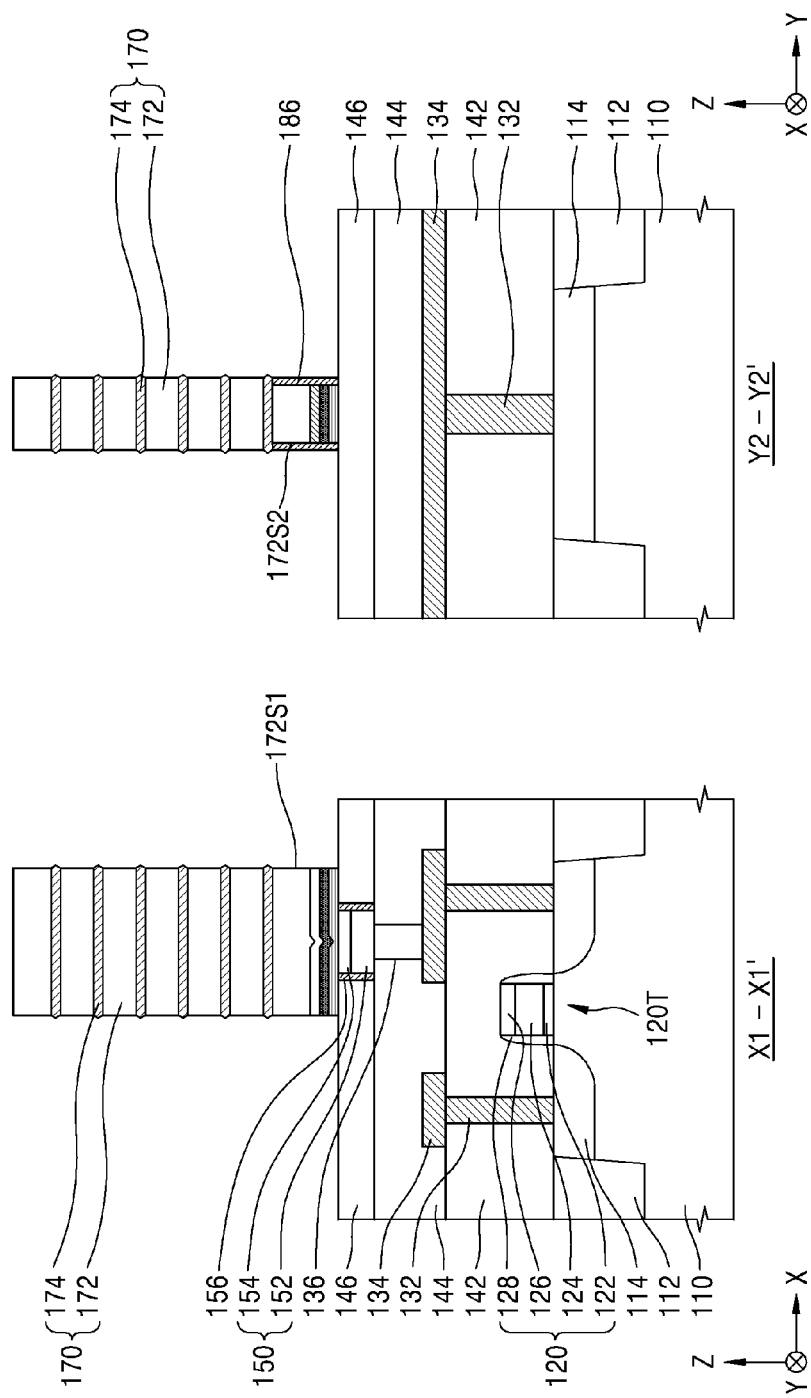

Referring to FIG. 19, a mask pattern may be formed on the mold stack 170S, and the mold structure 170 may be formed by etching the mold stack 170S by using the mask pattern as an etch mask. In the etching process, an etching rate of the first mold layer 172 and that of the second mold layer 174 may be different from each other, and accordingly, the sidewall portion of the second mold layer 174 may be formed to protrude outwardly with respect to the sidewall of the first mold layer 172.

Next, the first buried layer 222 may also be removed, and the top surface of the third insulating layer 146 may be exposed. In the removal process of the first buried layer 222, a portion of the insulating spacer 186 on two of the first sidewalls 172S1 spaced apart from each other in the first direction (e.g., X direction) of the first mold layer 172 at the lowermost portion may be removed together, and a portion of the insulating spacer 186 on two of the second sidewalls 172S2 apart from each other in the second direction (e.g., Y direction) of the first mold layer 172 at the lowermost portion may remain.

As a portion of the insulating spacer 186 is removed, both sidewalls spaced apart from each other of the first free layer portion 162P1, the first SOT inducing layer portion 164P1, and the first seed capping layer portion 166P1 in the first direction (e.g., X direction) may be exposed.

Figure 20A:
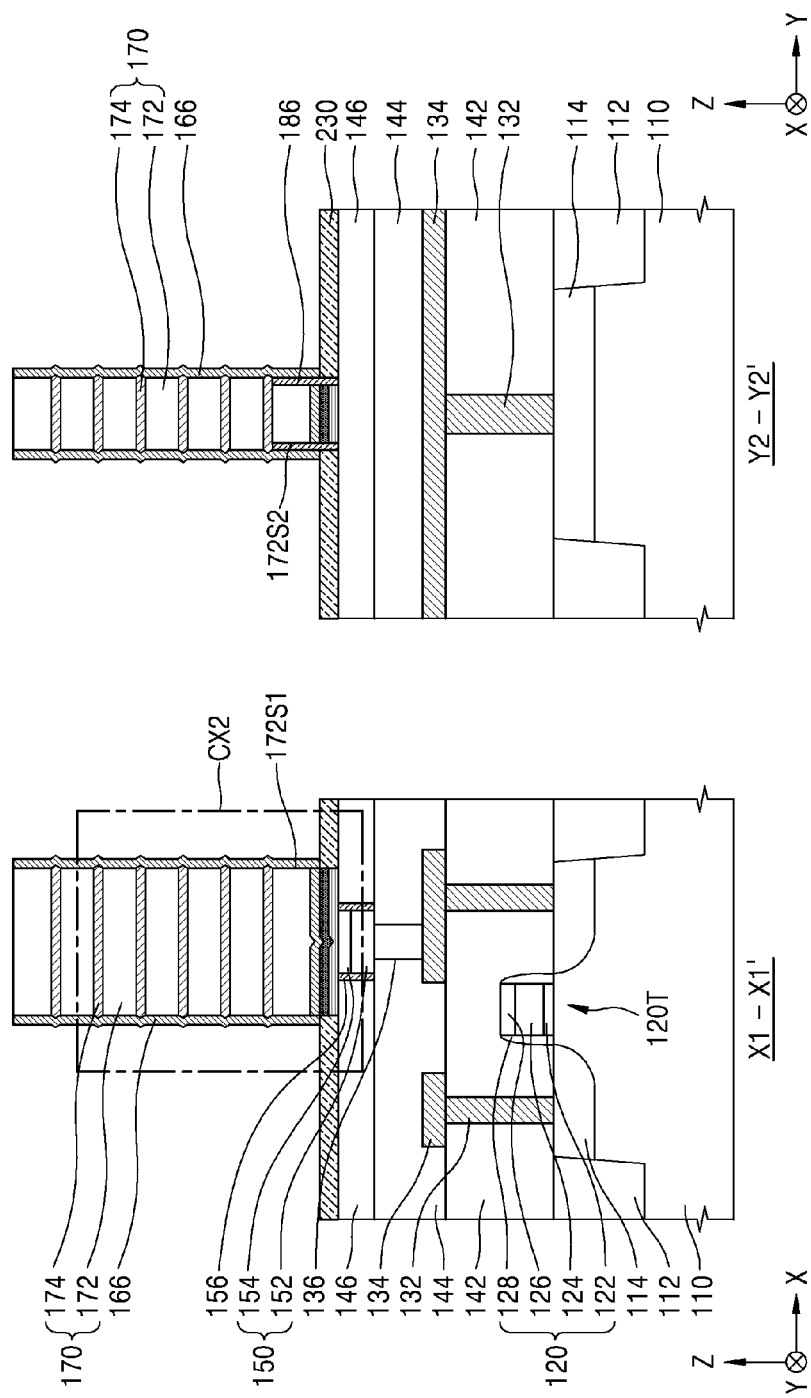
Figure 20B:
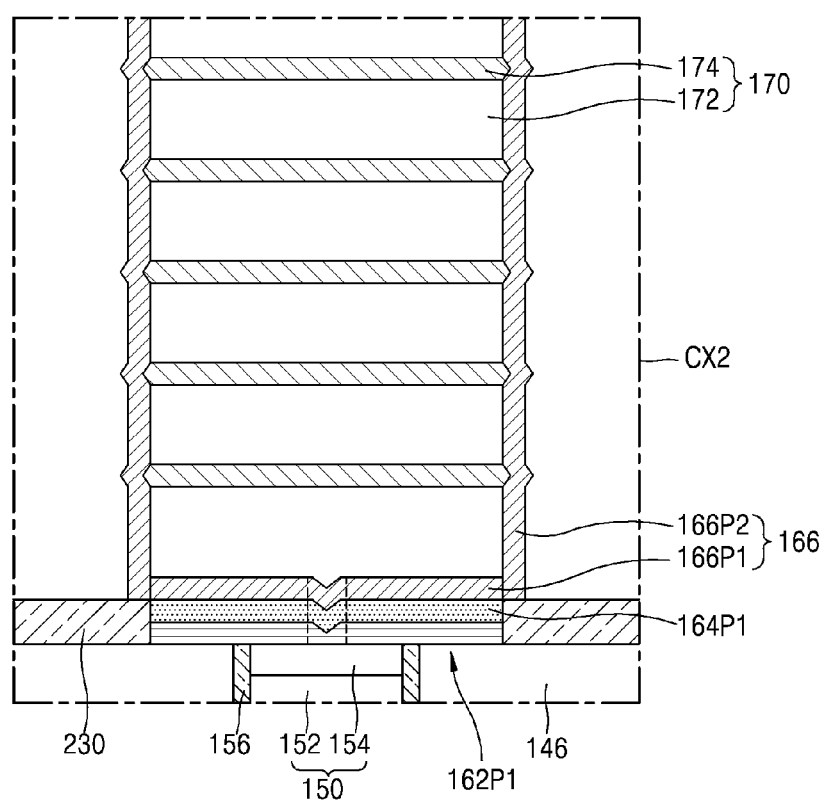

Referring to FIGS. 20A and 20B, a second buried layer 230 may be formed on the third insulating layer 146. The second buried layer 230 may cover exposed sidewalls of the first free layer portion 162P1, and the first SOT inducing layer portion 164P1, and may be formed to a relatively small thickness to cover at least a portion of the exposed sidewalls of the first seed capping layer portion 166P1. For example, the second buried layer 230 may be formed by spin coating a solution containing an organic compound having a high carbon content and baking the solution containing the organic compound. For example, the second buried layer 230 may be formed by using a spin-on hardmask (SOH) material.

Thereafter, a metal layer may be formed on the sidewall of the mold structure 170 and on the second buried layer 230, and the second seed capping layer portion 166P2 may remain on the sidewall of the mold structure 170 by performing an anisotropic etching on the metal layer and removing the metal layer on the second buried layer 230. In this case, a bottom portion of the second seed capping layer portion 166P2 may be connected to the exposed sidewall of the first seed capping layer portion 166P1. For example, the second seed capping layer portion 166P2 may be formed by an ALD process.

Figure 21:
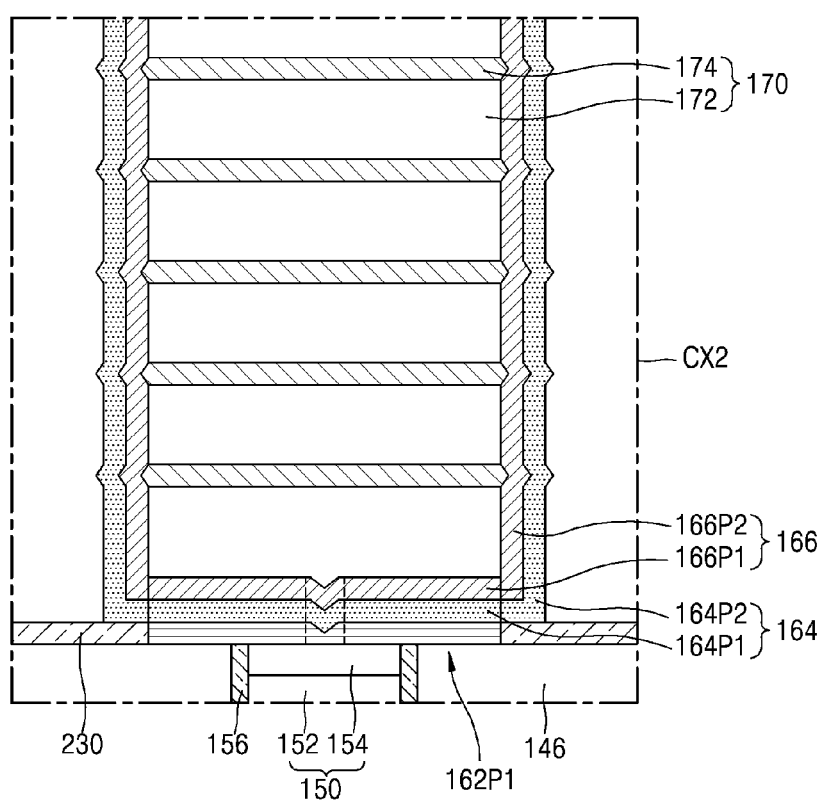

Referring to FIG. 21, the top surface of the second buried layer 230 may be removed by a certain thickness so that the sidewall of the first SOT inducing layer portion 164P1 is exposed. The process of removing the second buried layer 230 may include a dry etching process, an ion beam etching process, a plasma etching process including nitrogen or oxygen, but is not limited thereto.

Next, the second SOT inducing layer portion 164P2 may be formed on the sidewall of the second seed capping layer portion 166P2. For example, in the process of forming the second SOT inducing layer portion 164P2, a material layer formed on the top surface of the second buried layer 230 may be removed by an additional anisotropic etching process. In this case, the bottom portion of the second SOT inducing layer portion 164P2 may be connected to the exposed sidewall of the first SOT inducing layer portion 164P1.

Figure 22A:
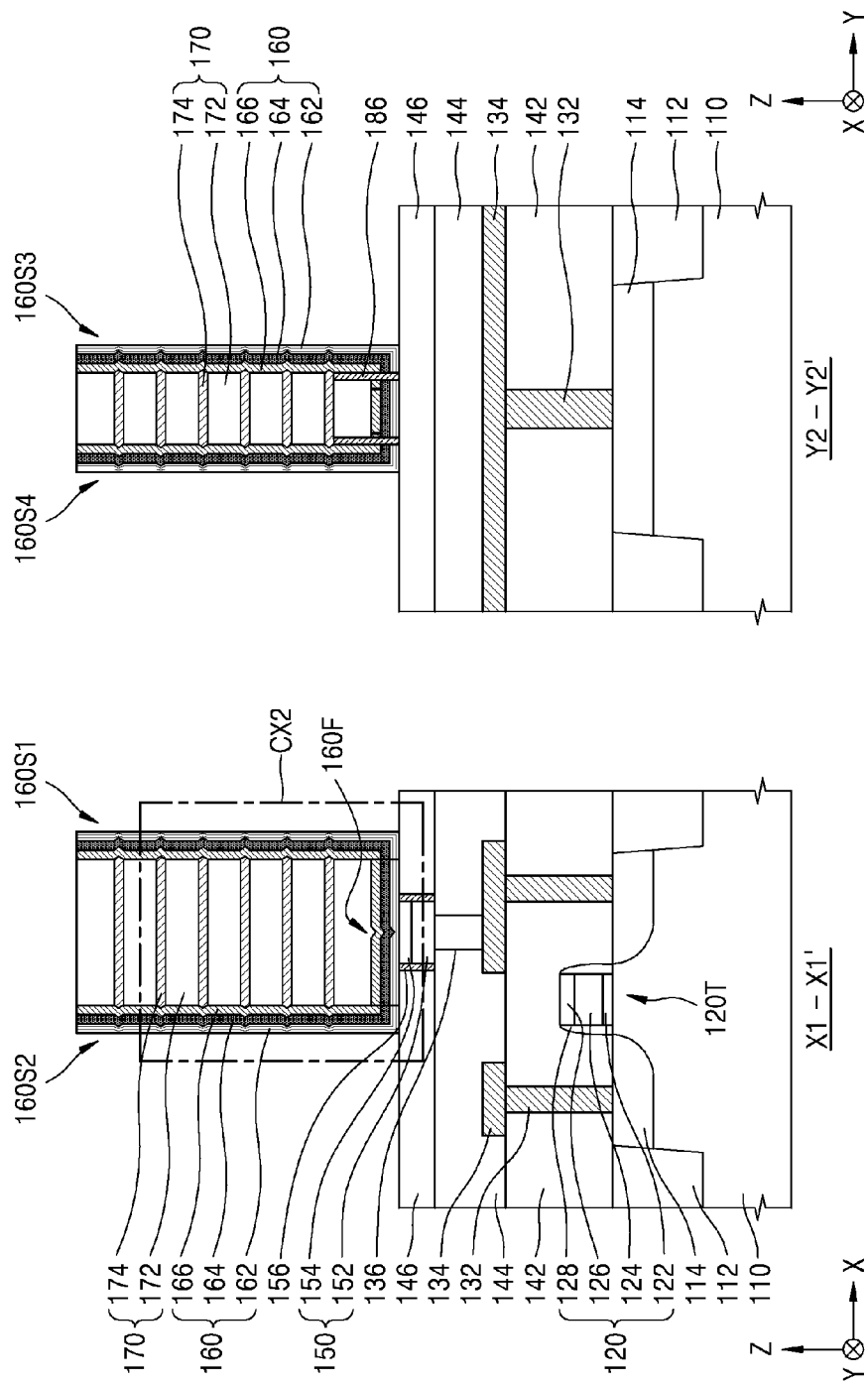
Figure 22B:
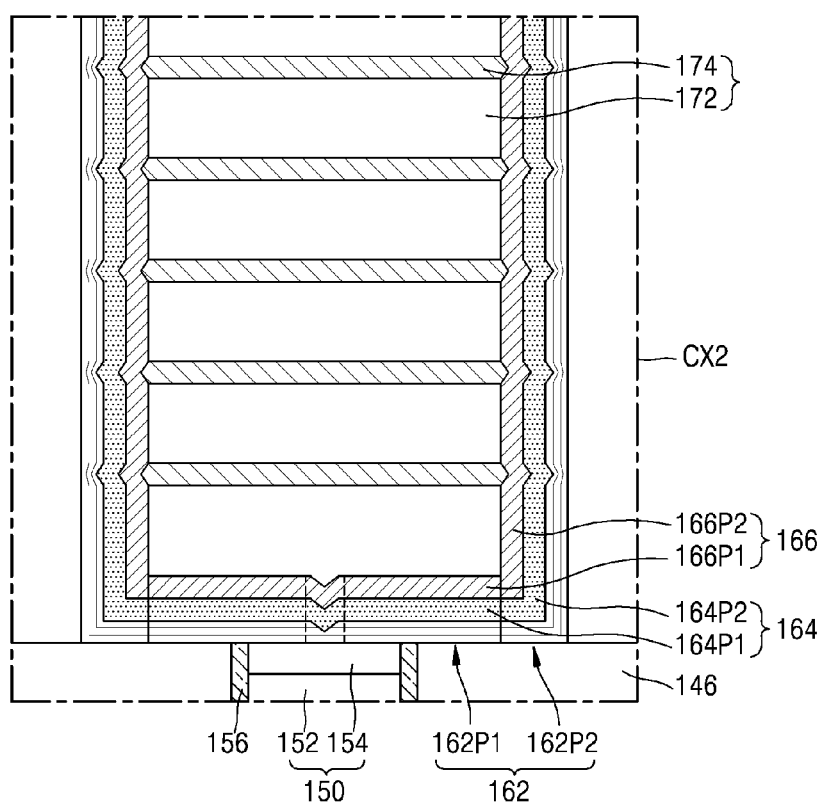

Referring to FIGS. 22A and 22B, the second buried layer 230 may be removed and the sidewall of the first free layer portion 162P1 may be exposed. Next, the second free layer portion 162P2 may be formed on the sidewall of the second SOT inducing layer portion 164P2. For example, in the process of forming the second free layer portion 162P2, a material layer formed on the top surface of the second buried layer 230 may be removed by an additional anisotropic etching process. In this case, the bottom portion of the second free layer portion 162P2 may be connected to the exposed sidewall of the first free layer portion 162P1.

As a result, the magnetic track layer 160 including the bottom portion 160F and the first through fourth sidewall portions 160S1 through 160S4 may be formed.

Referring to FIG. 23, the side SOT inducing layer 182 and the capping layer 184 may be sequentially formed on the first through sidewall portions 160S1 through 160S4 of the magnetic track layer 160.

Figure 24:
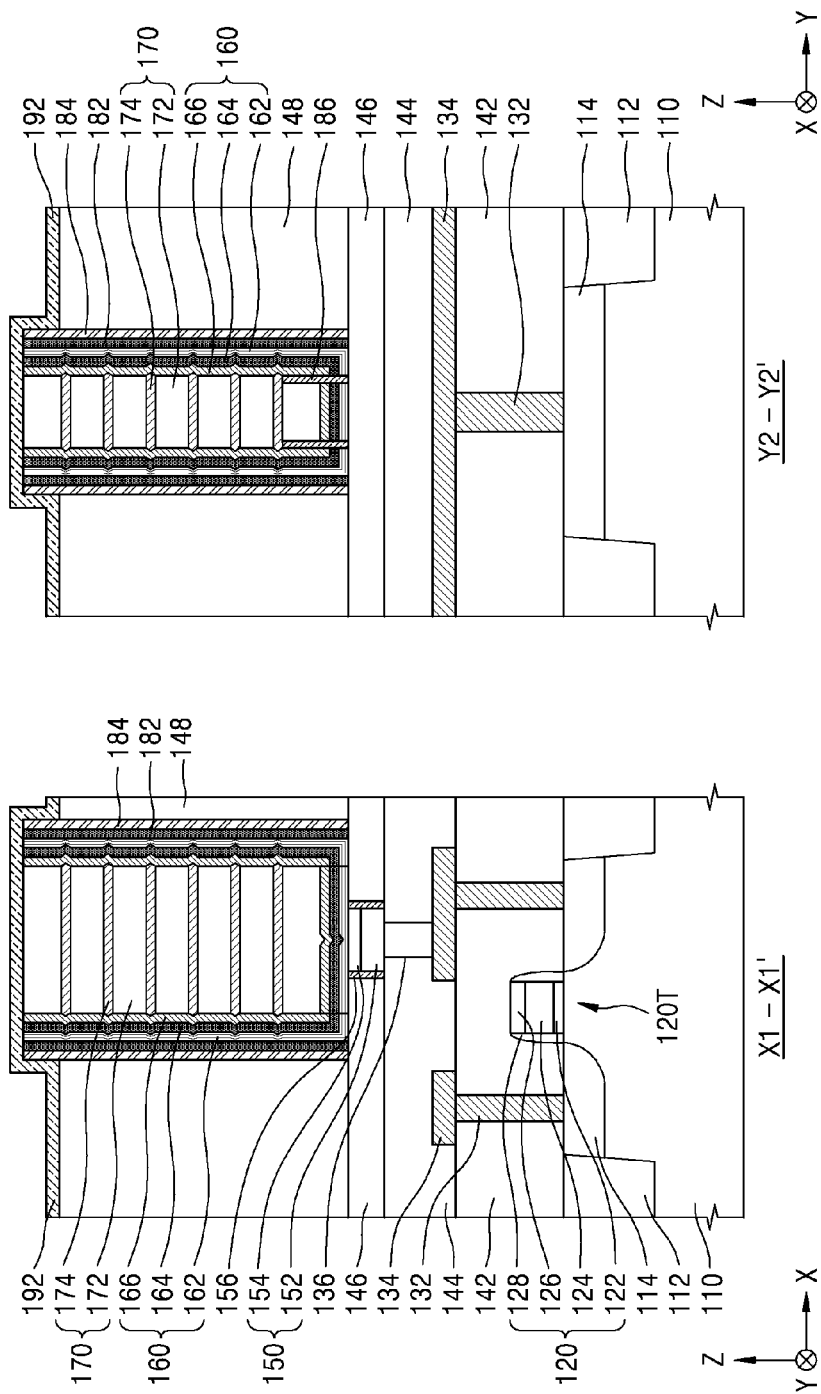

Referring to FIG. 24, the fourth insulating layer 148 covering the magnetic track layer 160 on the third insulating layer 146 may be formed. The fourth insulating layer 148 may include a SOH material, etc. The top surface of the fourth insulating layer 148 may be at a level lower than the top surface of the magnetic track layer 160. Next, the etch stop layer 192 may be formed on the top surfaces of the magnetic track layer 160 and the fourth insulating layer 148.

Figure 25:
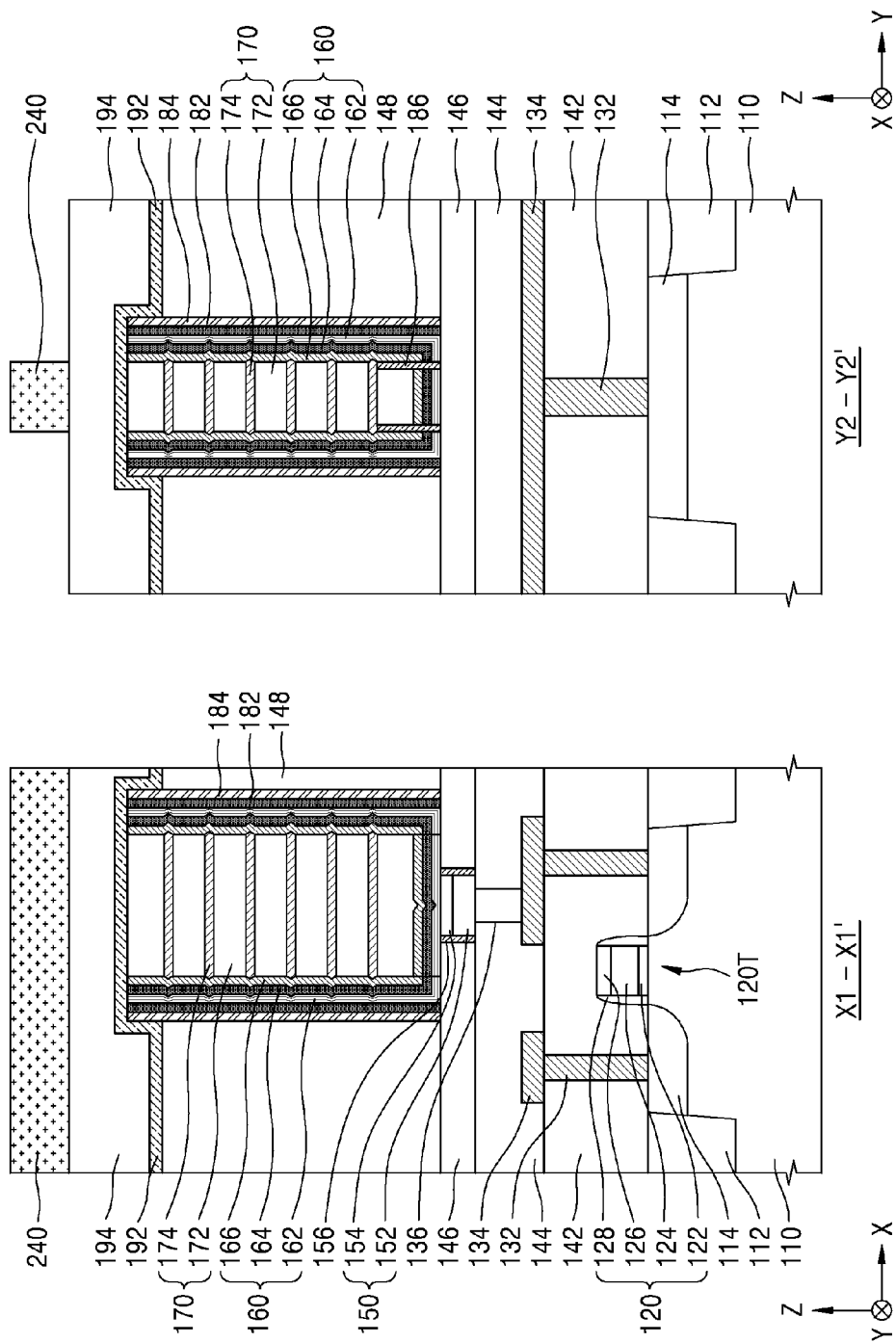

Referring to FIG. 25, the first top insulating layer 194 may be formed on the etch stop layer 192. A mask pattern 240 may be formed on the first top insulating layer 194.

Figure 26:
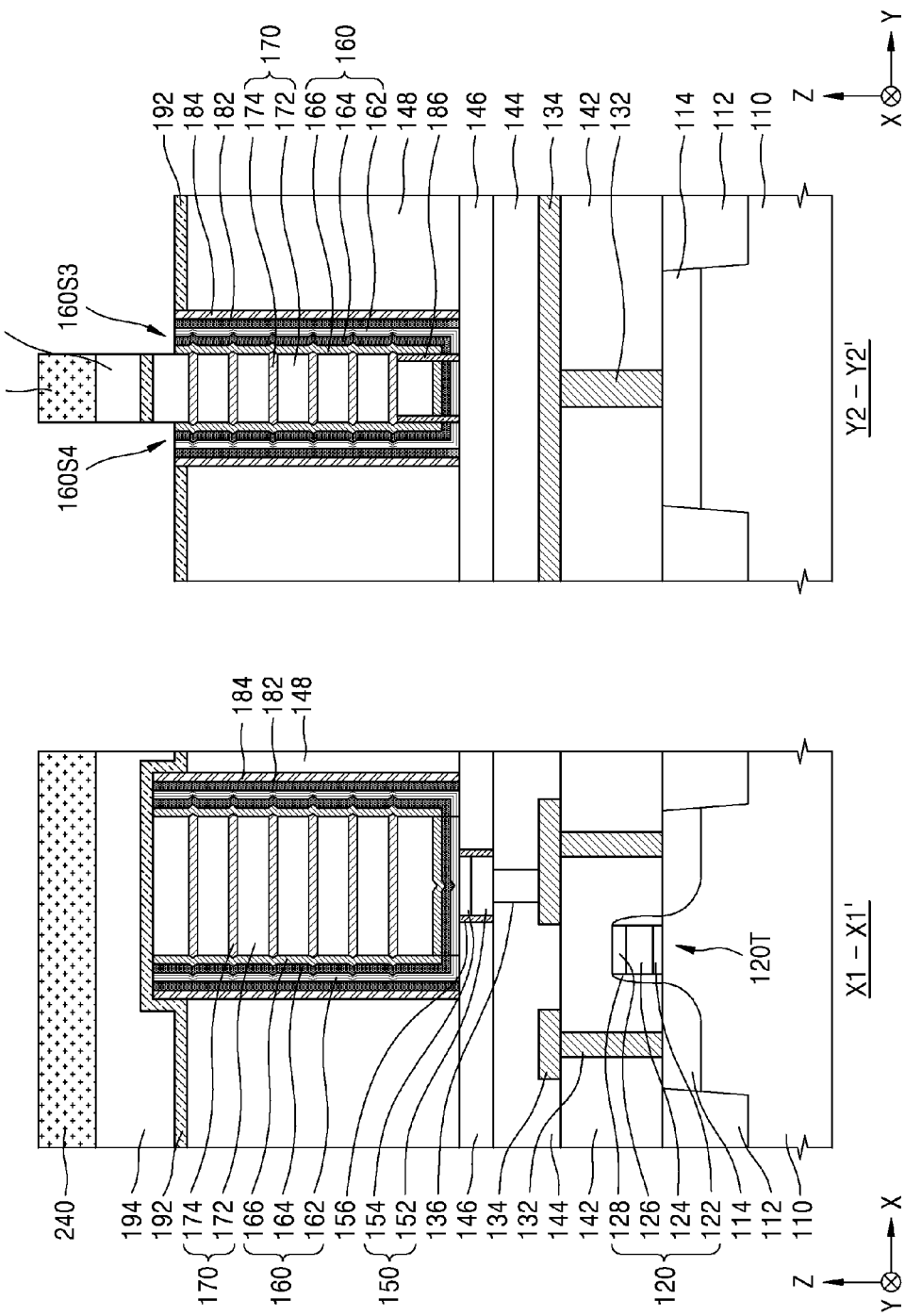

Referring to FIG. 26, upper portions of the first top insulating layer 194, the third sidewall portion 160S3 and the fourth sidewall portion 160S4 of the magnetic track layer 160 may be removed by using the mask pattern 240 as an etch mask so that the top surface of the etch stop layer 192 is exposed. Accordingly, the levels of the top surfaces of the third sidewall portion 160S3 and the fourth sidewall portion 160S4 may be lower than the levels of the top surfaces of the first sidewall portion 160S1 and the second sidewall portion 160S2.

Figure 27:
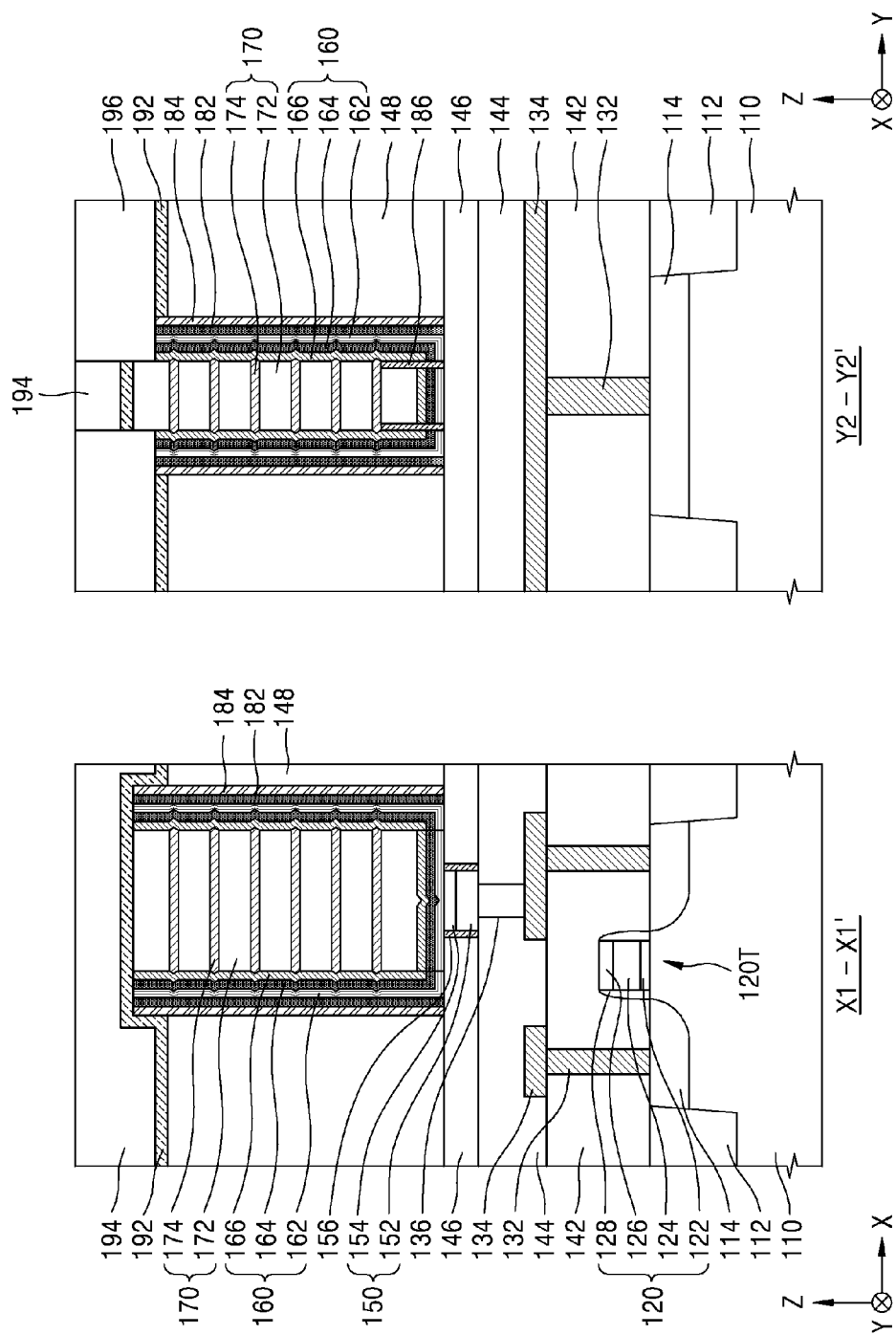

Referring to FIG. 27, the second top insulating layer 196 may be formed by forming an insulating layer on the top surfaces of the first top insulating layer 194 and the etch stop layer 192, and removing a top portion of the insulating layer so that the top surface of the first top insulating layer 194 is exposed.

Figure 28:
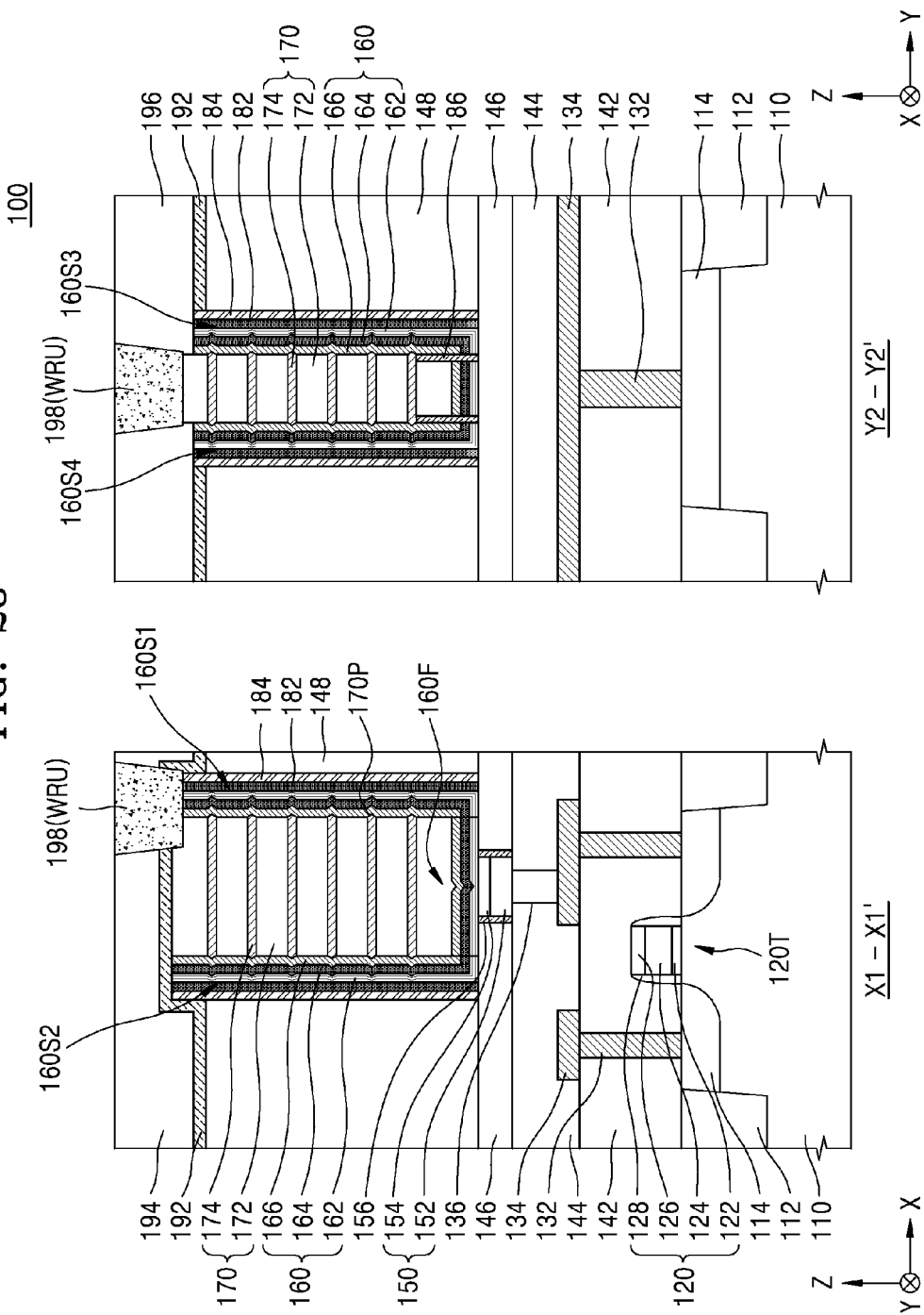

Referring to FIG. 28, portions of the first top insulating layer 194 and the etch stop layer 192 may be removed to form a contact hole, and then the write contact 198 may be formed in the contact hole by using a conductive material. For example, the write contact 198 may be formed to be connected to the first sidewall portion 160S1, and not to be connected to the third sidewall portion 160S3 and the fourth sidewall portion 160S4.

The magnetic memory device 100 may be completed by performing the above-described processes.

According to the above-described embodiments, the bottom notch 160FN may be formed at the bottom portion 160F of the magnetic track layer 160, and then the first through fourth sidewall portions 160S1 through 160S4 of the magnetic track layer 160 may be formed to include the sidewall notches 160SN while being connected to the bottom portion 160F. By the manufacturing method, the magnetic memory device 100, which is easy to adjust a movement of a magnetic domain wall in and is advantageous for high integration, may be obtained.

In the process described with reference to FIG. 16B, when a separation distance between the pair of wing portions 224 is relatively large or the thickness of the sidewall residue 160RS is relatively small, the width of the bottom notch 160FN may be relatively large. In this case, the magnetic memory device 100C described with reference to FIG. 6 may be obtained.

By way of summation and review, a method of forming a plurality of notches in a racetrack for adjusting the magnetic domain wall movement has been proposed. However, securing a stable magnetic domain wall movement and implementing a magnetic memory device having a high integration density at the same time may be difficult.

Therefore, embodiments provide a magnetic memory device that easily adjusts a magnetic domain wall movement and at the same time achieves a high integration density by including a vertical-type racetrack. Embodiments also provide a manufacturing method of a magnetic memory device with a vertical racetrack and easy control of a magnetic domain wall movement while high integration density is achieved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A magnetic memory device, comprising:
   a reading unit on a substrate;
   a magnetic track layer on the reading unit, the magnetic track layer including a first sidewall portion, a second sidewall portion, and a bottom portion between the first sidewall portion and the second sidewall portion; and
   a mold structure on the bottom portion of the magnetic track layer, and between the first sidewall portion and the second sidewall portion of the magnetic track layer,
   wherein the mold structure includes a plurality of first mold layers and a plurality of second mold layers that are alternately arranged in a first direction perpendicular to a top surface of the substrate, and
   wherein the magnetic track layer includes magnetic domains and magnetic domain walls between adjacent ones of the magnetic domains, the first sidewall portion and the second sidewall portion of the magnetic track layer including sidewall notches corresponding to respective ones of the magnetic domain walls, and the bottom portion includes a bottom notch corresponding to one of the magnetic domain walls.

2. The magnetic memory device as claimed in claim 1, wherein a first magnetic domain of the magnetic domains and a second magnetic domain of the magnetic domains adjacent to the first magnetic domain have different magnetization directions from each other.

3. The magnetic memory device as claimed in claim 1, wherein the magnetic track layer further includes a free layer, a spin orbit torque (SOT) inducing layer, and a seed capping layer that are sequentially arranged on the reading unit.

4. The magnetic memory device as claimed in claim 1, wherein:
   the mold structure includes protrusions on a sidewall of the mold structure, the plurality of second mold layers protruding outwardly with respect to sidewalls of the plurality of first mold layers to define the protrusions, and
   the sidewall notches contact the protrusions corresponding thereto.

5. The magnetic memory device as claimed in claim 1, wherein the plurality of first mold layers have a first height in the first direction, the plurality of second mold layers have a second height in the first direction, and the second height is less than the first height.

6. The magnetic memory device as claimed in claim 1, wherein the plurality of first mold layers include a material having an etch selectivity with respect to a material of the plurality of second mold layers.

7. The magnetic memory device as claimed in claim 1, wherein the reading unit includes:
   a fixed layer on the substrate; and
   a tunnel barrier layer on the fixed layer, the magnetic track layer including a free layer in contact with the tunnel barrier layer, and the magnetic memory device is configured to detect a magnetization direction indicated by the free layer and to read data.

8. The magnetic memory device as claimed in claim 1, further comprising a write contact on at least one of the first sidewall portion and the second sidewall portion of the magnetic track layer,
   wherein the magnetic memory device is configured to sequentially magnetize each of the magnetic domains of the magnetic track layer by applying a write current to the magnetic track layer via the write contact.

9. The magnetic memory device as claimed in claim 1, wherein the bottom notch vertically overlaps the reading unit.

10. The magnetic memory device as claimed in claim 1, wherein the magnetic track layer further includes:
    a seed capping layer including a first seed capping layer portion in contact with a bottom surface of the mold structure and a second seed capping layer portion in contact with a sidewall of the mold structure;
    a spin orbit torque (SOT) inducing layer including a first SOT inducing layer portion in contact with a bottom surface of the first seed capping layer portion, and a second SOT inducing layer portion in contact with a sidewall of the second seed capping layer portion; and a free layer including a first free layer portion in contact with a bottom surface of the first SOT inducing layer portion, and a second free layer portion in contact with a sidewall of the second SOT inducing layer portion.

11. The magnetic memory device as claimed in claim 10, wherein the first SOT inducing layer portion is connected to the second SOT inducing layer portion and includes a different material from that of the second SOT inducing layer portion.

12. The magnetic memory device as claimed in claim 10, wherein the free layer includes a synthetic antiferromagnet (SAF) structure, the SAF structure including a first ferromagnetic layer, a second ferromagnetic layer, and a non-ferromagnetic layer between the first ferromagnetic layer and the second ferromagnetic layer.

13. The magnetic memory device as claimed in claim 10, wherein the free layer includes at least one magnetic material of CoFeB, CoFeTb, CoFeGd, and CoFeDy, at least one magnetic material of $Fe_{50}Pt_{50}$, $Fe_{50}Pd_{50}$, $Co_{50}Pt_{50}$, $Co_{50}Pd_{50}$, and $Fe_{50}Ni_{50}$, or at least one stacked structure of a (Co/Pt)n stacked structure, a (CoFe/Pt)n stacked structure, a (CoFe/Pd)n stacked structure, a (Co/Pd)n stacked structure, a (Co/Ni)n stacked structure, a (CoNi/Pt)n stacked structure, a (CoCr/Pt)n stacked structure, and a (CoCr/Pd)n stacked structure (here, n is a natural number).

14. The magnetic memory device as claimed in claim 10, further comprising a sidewall SOT inducing layer in contact with a sidewall of the second free layer portion.

15. The magnetic memory device as claimed in claim 1, wherein:
the magnetic track layer surrounds an entire sidewall of the mold structure,
the first sidewall portion and the second sidewall portion are spaced apart from each other in a second direction parallel with the top surface of the substrate, the magnetic track layer further including a third sidewall portion and a fourth sidewall portion, the third sidewall portion and the fourth sidewall portion being spaced apart from each other in a third direction that is parallel with the top of the substrate and perpendicular to the second direction, and
the third sidewall portion and the fourth sidewall portion are spaced apart from the bottom portion by an insulating spacer.

16. A magnetic memory device, comprising:
a reading unit on a substrate, the reading unit including a fixed layer and a tunnel barrier layer; and
a magnetic track layer on the reading unit, the magnetic track layer including:
a bottom portion between a first sidewall portion and a second sidewall portion,
magnetic domains and magnetic domain walls between adjacent ones of the magnetic domains, the first sidewall portion and the second sidewall portion including sidewall notches corresponding to respective ones of the magnetic domain walls, and the bottom portion including a bottom notch corresponding to one of the magnetic domain walls, and
a free layer, a spin orbit torque (SOT) inducing layer, and a seed capping layer sequentially stacked in a thickness direction of the magnetic track layer.

17. The magnetic memory device as claimed in claim 16, wherein:
the first sidewall portion and the second sidewall portion are spaced apart from each other in a first horizontal direction parallel with a top surface of the substrate,
the magnetic track layer further includes a third sidewall portion and a fourth sidewall portion that are spaced apart from each other in a second horizontal direction parallel with the top surface of the substrate, and
the third sidewall portion and the fourth sidewall portion are not connected with the bottom portion.

18. The magnetic memory device as claimed in claim 17, wherein the reading unit is on at least one of the first sidewall portion and the second sidewall portion, the reading unit not being connected to the third sidewall portion and the fourth sidewall portion.

19. A magnetic memory device, comprising:
a reading unit on a substrate;
a magnetic track layer on the reading unit, the magnetic track layer including a first sidewall portion, a second sidewall portion, and a bottom portion between the first sidewall portion and the second sidewall portion; and
a mold structure on the bottom portion of the magnetic track layer and between the first sidewall portion and the second sidewall portion of the magnetic track layer,
wherein the mold structure includes protrusions protruding outwardly on a sidewall of the mold structure, and the first sidewall portion and the second sidewall portion including sidewall notches in contact with the protrusions.

20. The magnetic memory device as claimed in claim 19, wherein:
the bottom portion of the magnetic track layer includes a bottom notch, the bottom notch corresponding to a magnetic domain wall,
the bottom notch has a first width in a first horizontal direction parallel with a top surface of the substrate, and
each of the sidewall notches has a first height in a direction vertical to the top surface of the substrate, the first width being greater than the first height.

* * * * *